(12) United States Patent
Chang et al.

(10) Patent No.: US 11,903,304 B2
(45) Date of Patent: Feb. 13, 2024

(54) PHOTODIODE COMPRISING FLUROPOLYMER COMPOUND

(71) Applicant: RAYNERGY TEK INCORPORATION, Hsinchu (TW)

(72) Inventors: Yi-Ming Chang, Hsinchu (TW); Chuang-Yi Liao, Hsinchu (TW); Wei-Long Li, Hsinchu (TW); Kuen-Wei Tsai, Hsinchu (TW); Huei Shuan Tan, Hsinchu (TW); Nicolas Blouin, Grez-Doiceau (BE); Luca Lucera, Darmstadt (DE); Tim Poertner, Frankfurt am Main (DE); Graham Morse, Toronto (CA); Priti Tiwana, North Baddesley (GB)

(73) Assignee: RAYNERGY TEK INCORPORATION, Hsinchu (TW)

( * ) Notice: Subject to any disclaimer, the term of this patent is extended or adjusted under 35 U.S.C. 154(b) by 627 days.

(21) Appl. No.: 17/119,153

(22) Filed: Dec. 11, 2020

(65) Prior Publication Data
US 2022/0199907 A1    Jun. 23, 2022

(51) Int. Cl.
*H10K 85/10*  (2023.01)
*H10K 71/40*  (2023.01)
(Continued)

(52) U.S. Cl.
CPC ....... *H10K 85/1135* (2023.02); *C08G 61/126* (2013.01); *C08G 73/0266* (2013.01);
(Continued)

(58) Field of Classification Search
CPC .... H10K 85/1135; H10K 71/40; H10K 30/30; H10K 30/81; C08G 61/126; C08G 73/0266; C08G 2261/3223; C08G 2261/44; C08G 2261/91; C08G 2261/1424; C08G 2261/512; C08G 2261/794; C08G 2261/95; C08L 27/22; C08L 27/18; C08L 2203/16;
(Continued)

(56) References Cited

U.S. PATENT DOCUMENTS

2006/0076557 A1    4/2006    Waller et al.
2018/0105709 A1    4/2018    De Campo et al.

FOREIGN PATENT DOCUMENTS

CN    107646147 A    1/2018
JP    2014-90114 A    5/2014
(Continued)

OTHER PUBLICATIONS

Jorgensen, et al. "Stability/Degradation of Polymer Solar Cells." Solar Energy Mater. & Solar Cells, 92(7) (Jul. 2008) pp. 686-714. doi:10.1016/j.solmat.2008.01.005.
(Continued)

*Primary Examiner* — Kyoung Lee
(74) *Attorney, Agent, or Firm* — WPAT, P.C

(57) ABSTRACT

The invention relates to a photodiode, like an photovoltaic (OPV) cell or photodetector (OPD), comprising, between the photoactive layer and an electrode, a hole selective layer (HSL) for modifying the work function of the electrode and/or the photoactive layer, wherein the HSL comprises a fluoropolymer and optionally a conductive polymer, and to a composition comprising such a fluoropolymer and a conductive polymer.

27 Claims, 9 Drawing Sheets

(51) Int. Cl.
*C08G 61/12* (2006.01)
*C08L 27/22* (2006.01)
*C08G 73/02* (2006.01)
*H10K 30/30* (2023.01)
*H10K 30/81* (2023.01)

(52) U.S. Cl.
CPC .............. *C08L 27/22* (2013.01); *H10K 71/40* (2023.02); *C08G 2261/3223* (2013.01); *C08G 2261/44* (2013.01); *C08G 2261/91* (2013.01); *H10K 30/30* (2023.02); *H10K 30/81* (2023.02)

(58) Field of Classification Search
CPC ..... C08L 65/00; C09D 127/18; C09D 127/22; C09D 165/00; C08F 214/262; H01B 1/125; H01B 1/127
See application file for complete search history.

(56) References Cited

FOREIGN PATENT DOCUMENTS

| | | | | |
|---|---|---|---|---|
| JP | 2018-510453 A | 4/2018 | | |
| JP | WO2019176662 A1 | 2/2021 | | |
| TW | 201436327 A | 9/2014 | | |
| WO | 2014/089708 A1 | 6/2014 | | |
| WO | WO-2014089708 A1 * | 6/2014 | ............. | B82Y 30/00 |
| WO | 2016/140916 A1 | 9/2016 | | |
| WO | 2016142437 A1 | 9/2016 | | |
| WO | 2017/014946 A1 | 1/2017 | | |

OTHER PUBLICATIONS

Norman, et al. "Degradation Patterns in Water and Oxygen of an Inverted Polymer Solar Cell." J. Am. Chem. Soc. 132(47) (Nov. 2010), pp. 16883-16892. doi: 10.1021/ja106299g.

Yambem, et al. "Stable Organic Photovoltaics Using Ag Thin Film Anodes." J. Mater. Chem. 22(14) (Feb. 2012), pp. 6894-6898. doi: 10.1039/c2jm15670a.

Lim, et al. "Influence of a Novel Fluorosurfactant Modified PEDOT:PSS Hole Transport Layer on the Performance of Inverted Organic Solar Cells." J. Mater. Chem. 22(48) (Oct. 2012), pp. 25057-25064 doi: 10.1039/c2jm35646e.

Lipomi, et al. "Stretchable Organic Solar Cells." Adv. Mater. 23(15) (Apr. 2011), pp. 1771-1775. doi: 10.1002/adma.201004426.

Hou, et al. "Improvement of the Power Conversion Efficiency and Long Term Stability of Polymer Solar Cells by Incorporation of Amphiphilic Nafion Doped PEDOT-PSS as a Hole Extraction Layer." J. Mater. Chem. A 3(15) (Aug. 2015), pp. 18727-18734. doi: 10.1039/C5TA03967C.

Communication From the Taiwan Patent Office Regarding a Counterpart Foreign Application dated (Taiwan Year 110) Dec. 29, 2021.

Communication From the European Patent Office Regarding a Counterpart Foreign Application dated May 18, 2021.

Communication From the Japanese Patent Office Regarding a Counterpart Foreign Application dated Emperor Year—REIWA 4) Jan. 11, 2022.

Office Action which was issued to Japanese counterpart application No. 2020-203382 dated Oct. 4, 2022, with an English Translation thereof.

* cited by examiner

PHOTODIODE COMPRISING FLUROPOLYMER COMPOUND

TECHNICAL FIELD

The invention relates to a photodiode, like an photovoltaic (PV) cell or photodetector (PD), and light emitting device comprising, between the active layer and an electrode, a hole selective layer (HSL) for modifying the work function of the electrode and/or the active layer, wherein the HSL comprises a fluoropolymer and optionally a conductive polymer, and to a composition comprising such a fluoropolymer and a conductive polymer.

BACKGROUND

In recent years, there has been development of optoelectronic like PV cells, PDs. These devices are typically composed of several layers, including a photoactive layer which absorbs light from a natural or artificial source and generates either electron-hole pairs or excitons which are converted into electricity, and which is situated between an electron collecting electrode and a hole collecting electrode.

The active layer in a PV or PD device is usually composed of at least one material, a semiconductor.

The semiconductor acts as a photon absorber, forming an exciton. This exciton migrates onto the interface. After exciton separation, the holes are transported to the hole selective electrode and the electrons are transported to the electron selective electrode.

The device usually also includes one or more further layers between the respective electrode and the active layer. Thus, it has been observed that the presence of a hole selective layer (HSL) between the photoactive layer and the hole collecting electrode is beneficial for the operation of the device, as it enables modifying the work function and better matching the work function of the active layer and the electrode.

Typical HSLs known from prior art may comprise for example materials such as a metal oxide, like for example, ZTO, $MoO_x$, $NiO_x$, $WO_x$, $V_xO_y$, an inorganic salt, like for example bismuth selenide and copper iodide, a conjugated polymer electrolyte, like for example PEDOT:PSS, a conjugated polymer, like for example polytriarylamine (PTAA), a fluoropolymer, like for example Nafion®, or an organic compound, like for example N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD).

For industrial applications, a conductive polymer like poly(3,4-ethylenedioxythiophene):poly(styrenesulfonate) (PEDOT:PSS) is usually preferred due to its ease of use in a roll-to-roll device manufacturing process and its commercial availability. However, this material offers nonetheless significant drawbacks affecting the device performance and stability like the following (see for example Joergensen et al., *Sol. Ener. Mat. & Solar Cells* 2008, 92, 686-714; Krebs et al., *J. Am. Chem. Soc.* 2010, 132, 16883-16892 and Curran et al., *J. Mater. Chem.* 2012, 22, 6894-6898):

1) Work function: The work function of commercially available PEDOT:PSS is often not aligned with the work function of the photoactive layer. The energy misalignment generates extra stress in the PV cells overtime, resulting in accelerated degradation over the lifetime of the assembled modules.
2) Corrosion: The high loading of poly(styrenesulfonic acid) to obtain high conductivity often degrades the coating equipment and the electrodes and other compounds of the photovoltaic cells overtime, resulting in accelerated degradation over the lifetime of the assembled modules.
3) Hygroscopicity: The hygroscopic properties of poly (styrenesulfonic acid) often leads to residual water in the final device and increased water intake over the lifespan of the photovoltaic cells, resulting in accelerated degradation over the lifetime of the assembled modules.

In prior art it has been proposed to resolve this issue in polymer solar cells for example by the use of a hydrophobic additive like the fluorosurfactants Zonyl® (E. I. du Pont de Nemours and Company) or Capstone® (The Chemours Company), see for example Ho et al., *J. Mater. Chem.* 2012, 22, 25057-25064; Bao et al., *Adv. Mater.* 2011, 23, 1771-1775 and WO 2016/142437 A1. Another solution proposed in prior art for solar cells is to dope the PEDOT/PSS with the perfluorinated sulfonic acid polymer Nafion® (The Chemours Company), see for example Hou et al., *J. Mater. Chem. A*, 2015, 3, 18727-18734.

WO 2005/090434 A1 and US 2006/076557 A1 disclose an aqueous dispersion comprising a polythienothiophene (PTT) and a highly fluorinated or perfluorinated sulfonic acid polymer (FSA) like for example Nafion® and its use in the hole injection layer (HIL) of electronic devices, especially OLEDs and OTFTs. The examples of WO 2005/090434 A1 describe dispersions comprising PEDOT/Nafion®. The examples of US 2006/076557 describe the performance of OLEDs comprising a hole injection layer (HIL) made from PTT/Nafion® in comparison with OLEDs comprising a (HIL) made from PEDOT/PSS.

It was an aim of the present invention to provide an HSL for use in photodiodes, which can overcome the drawbacks of the HSLs from prior art, and which can provide one or more advantageous properties, especially better matching of the work function of the photoactive layer and the hole collecting electrode, increased device lifetime, improved device performance, and improved manufacturing capability such as better coating quality, better wetting of the photoactive layer and/or the electrode, and better surface energy matching with the photoactive layer and/or the electrode.

Another aim of the invention was to extend the pool of hole selective layers available to the expert. Other aims of the present invention are immediately evident to the expert from the following detailed description.

The inventors of the present invention have found that one or more of the above aims can be achieved by providing a HSL and an organic photodiode, preferably an organic PV (OPV) or organic PD (OPD), comprising it, wherein the HSL contains a fluoropolymer of formula I as disclosed hereinafter, which is known and commercially available under the name Aquivion® (Solvay). It was surprisingly found that the use of this material allows to solve the above problems and provides improved HSLs and OPVs and OPDs. Especially, as demonstrated in the examples of this invention, the use of Aquivion® in the HSL of an OPV device does surprisingly provide a significant improvement of the device performance compared to a device wherein the HSL comprises Nafion®. This effect could not have been expected from prior art.

In prior art Aquivion® has been disclosed for use in OLEDs. Chin et al., *J. Information Display*, 2011, 12(4), 223-227 discloses an OLED that either comprises a PEDOT: PSS HIL plus an additional fluoropolymer interfacial layer (FPI) which contains Aquivion® or Nafion®, or the OLED comprises a HIL with a mixture PEDOT:PSS:Aquivion® or Nafion®.

However, the use of Aquivion® to replace PSS in the HSL of an OPV or OPD device has not been disclosed or suggested in prior art.

SUMMARY

The invention relates to a photodiode, which is preferably a photovoltaic (PV) or photodetector (PD) device, comprising
- a photoactive layer,
- a hole collecting electrode and an electron collecting electrode located on opposite sides of the photoactive layer,
- a first hole selective layer (HSL) which is located between the photoactive layer and the hole collecting electrode, and which comprises a fluoropolymer of formula I

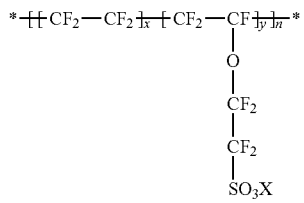

I wherein
X is selected from the group consisting of H, Li, Na and K, preferably X is H,
x is 0.01 to 0.99,
y is 0.99 to 0.01, and x+y=1,
n is an integer >1.

In a preferred embodiment the first HSL layer further comprises a conductive polymer.

In another preferred embodiment the photodiode further comprises a second HSL comprising a conductive polymer, wherein said second HSL is located between the photoactive layer and the hole collecting electrode, and is preferably located between the first HSL and the hole collecting electrode. In this preferred embodiment preferably the first HSL layer does not contain, in addition to the fluoropolymer of formula I, a conductive polymer.

The invention further relates to a polymer blend comprising a fluoropolymer of formula I and a conductive polymer.

The invention further relates to a composition comprising a fluoropolymer of formula I, a conductive polymer, and one or more solvents, wherein the composition does not contain poly(styrenesulfonic acid) or a poly(styrenesulfonate).

The invention further relates to a process of manufacturing a photodiode as described above and below, which comprises the following steps The invention further relates to a photodiode which is an organic photovoltaic (OPV) device, and organic photodetector (OPDs) or a perovskite-based solar cell (PSC), organic light emitting diode (OLED), and quantum dot LED (QLED), preferably an OPV or OPD device.

The invention further relates to a sensor device which comprises an OPD as described above and below. The sensor device is for example a biosensor, or a detector or detector array for vein pattern recognition.

The invention further relates to the use of the OPD or sensor as described above and below for applications including but not limited to biometrics, e.g. the recognition or imaging of finger geometrics or vein patterns.

TERMS AND DEFINITIONS

Figure 1A:
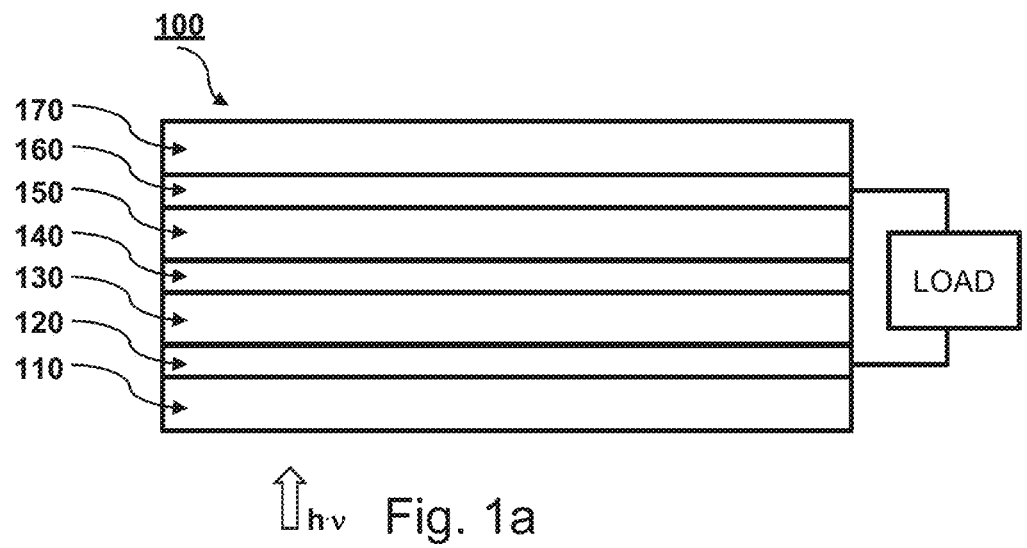
FIGS. 1a, b and 2a, b are schematic cross-sectional views of exemplary photodiodes according to the present invention.

In formula I the group —SO$_3$X covers both the sulfonic acid (if X is H) and the corresponding alkali salts (if X is Li, Na or K). In the latter case the —SO$_3$X group is understood to include the corresponding charged species —SO$_3^-$Li$^+$, —SO$_3^-$Na$^+$ and —SO$_3^-$K$^+$, respectively.

As used herein, the term "hole selective" will be understood to mean a layer or material that is electrically conducting or semiconducting preferably holes but not electrons, and the term "electron selective" will be understood to mean a layer or material that is electrically conducting or semiconducting preferably electrons but not holes. Examples for hole selective layers (HSLs) are hole transporting layers (HTLs) or electron blocking layers (EBLs). Examples for electron selective layers (ESLs) are electron transporting layers (ETLs) or hole blocking layers (HBLs).

As used herein, the terms "high work function electrode" and "low work function electrode" are meant relative to each other, so that the high work function electrode (which is usually the hole collecting electrode or anode) has a higher work function than the low work function electrode, and typically also has a higher work function than the photoactive layer, while the low work function electrode (which is usually the electron collecting electrode or cathode) has a lower work function than the high work function electrode, and typically also has a lower work function than the photoactive layer.

As used herein, in a formula showing a polymer or a repeat unit, an asterisk (*) will be understood to mean a chemical linkage to an adjacent unit or to a terminal group in the polymer backbone. In a ring, like for example a benzene or thiophene ring, an asterisk (*) will be understood to mean a C atom that is fused to an adjacent ring.

As used herein, the terms "repeat unit", "repeating unit" and "monomeric unit" are used interchangeably and will be understood to mean the constitutional repeating unit (CRU), which is the smallest constitutional unit the repetition of which constitutes a regular macromolecule, a regular oligomer molecule, a regular block or a regular chain (*Pure Appl. Chem.*, 1996, 68, 2291). As further used herein, the term "unit" will be understood to mean a structural unit which can be a repeating unit on its own, or can together with other units form a constitutional repeating unit.

As used herein, the term "carbyl group" will be understood to mean any monovalent or multivalent organic moiety which comprises at least one carbon atom either without any non-carbon atoms (like for example —C≡C—), or optionally combined with at least one non-carbon atom such as B, N, O, S, P, Si, Se, Sn, As, Te or Ge (for example carbonyl etc.).

As used herein, the term "hydrocarbyl group" will be understood to mean a carbyl group that does additionally contain one or more H atoms and optionally contains one or more hetero atoms like for example B, N, O, S, P, Si, Se, As, Te or Ge.

As used herein, the term "hetero atom" will be understood to mean an atom in an organic compound that is not a H- or C-atom, and preferably will be understood to mean B, N, O, S, P, Si, Se, As, Te or Ge.

A carbyl or hydrocarbyl group comprising a chain of 3 or more C atoms may be straight-chain, branched and/or cyclic, and may include spiro-connected and/or fused rings.

Preferred carbyl and hydrocarbyl groups include alkyl, alkoxy, thioalkyl, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more hetero atoms, preferably selected from the group consisting of B, N, O, S, P, Si, Se, As, Te and Ge.

Further preferred carbyl and hydrocarbyl group include for example: a $C_1$-$C_{40}$ alkyl group, a $C_1$-$C_{40}$ fluoroalkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_2$-$C_{20}$ ketone group, a $C_2$-$C_{20}$ ester group, a $C_6$-$C_{12}$ aryl group, and a $C_4$-$C_{20}$ polyenyl group, respectively.

Also included are combinations of groups having carbon atoms and groups having hetero atoms, like e.g. an alkynyl group, preferably ethynyl, that is substituted with a silyl group, preferably a trialkylsilyl group.

The carbyl or hydrocarbyl group may be an acyclic group or a cyclic group. Where the carbyl or hydrocarbyl group is an acyclic group, it may be straight-chain or branched. Where the carbyl or hydrocarbyl group is a cyclic group, it may be a non-aromatic carbocyclic or heterocyclic group, or an aryl or heteroaryl group.

A non-aromatic carbocyclic group as referred to above and below is saturated or unsaturated and preferably has 4 to 30 ring C atoms. A non-aromatic heterocyclic group as referred to above and below preferably has 4 to 30 ring C atoms, wherein one or more of the C ring atoms are optionally replaced by a hetero atom, preferably selected from the group consisting of N, O, P, S, Si and Se, or by a —S(O)— or —S(O)$_2$— group. The non-aromatic carbo- and heterocyclic groups are mono- or polycyclic, may also contain fused rings, preferably contain 1, 2, 3 or 4 fused or unfused rings, and are optionally substituted with one or more groups L, wherein L is selected from the group consisting of F, Cl, —CN, —NC, —NCO, —NCS, —OCN, —SCN, —R$^\circ$, —OR$^\circ$, —SR$^\circ$, —C(=O)X$^\circ$, —C(=O)R$^\circ$, —C(=O)—OR$^\circ$, —O—C(=O)—R$^\circ$, —NH$_2$, —NHR$^\circ$, —NR$^\circ$R$^{\circ\circ}$, —C(=O)NHR$^\circ$, —C(=O)NR$^\circ$R$^{\circ\circ}$, —SO$_3$R$^\circ$, —SO$_2$R$^\circ$, —OH, —NO$_2$, —CF$_3$, —SF$_5$, or optionally substituted silyl, or carbyl or hydrocarbyl with 1 to 30, preferably 1 to 20 C atoms that is optionally substituted and optionally comprises one or more hetero atoms, wherein X0 is halogen, preferably F or Cl, and R$^\circ$, R$^{\circ\circ}$ denote H or straight-chain or branched alkyl with 1 to 20, preferably 1 to 12 C atoms that is optionally fluorinated.

Above and below, "mirror image" means a moiety that is obtainable from another moiety by flipping it vertically or horizontally across an external symmetry plane or a symmetry plane extending through the moiety. For example, the moiety also includes the mirror images

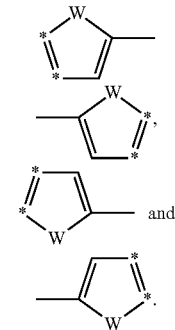

DETAILED DESCRIPTION

Figure 3:
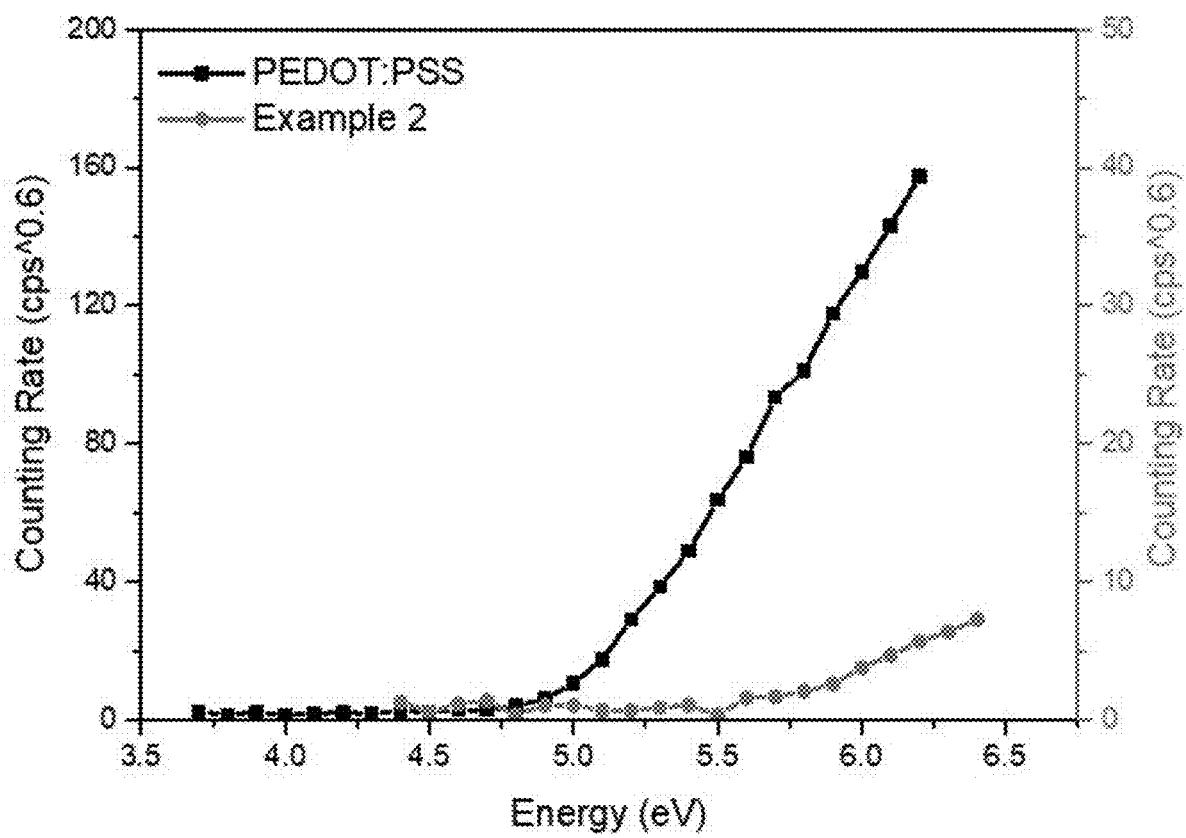
FIG. 3 shows the work function of the comparative example (PEDOT:PSS) and Example 2 according to the present invention

Compared to photodiodes as disclosed in prior art which contain an HSL with PEDOT/PSS, the present invention allows to replace the PSS by the fluoropolymer of formula I which has less negative impact on device performance and device stability. In particular, the photodiode according to the present invention demonstrates the following improved properties compared to devices of prior art with an HSL based on PEDOT:PSS:

1) Increased device lifetime due to improve hydrophobic properties of the fluoropolymer ionomer.
2) Increased device performance due to a work function of the hole transport layer better matching the active layer work function. The work function improvement compared to PEDOT:PSS is shown in FIG. 3.
3) Increased coating quality and/or ease of the hole transport layer due to better wetting of the active layer and better surface energy matching.

The fluoropolymer of formula I is commercially available under the name Aquivion® (Solvay). It is obtainable e.g. by copolymerization of tetrafluoroethylene (TFE) and the perfluorinated vinyl ether CF$_2$=CF—O—CF$_2$CF$_2$SO$_2$F or perfluoro(3-oxa-4-pentenesulfonyl fluoride) (POPF), followed by conversion to sulfonic acid or sulfonate groups by hydrolysis of the sulfonyl fluoride groups and further ion exchange if necessary to convert to the desired ionic form.

In the polymer of formula I preferably x≥y, very preferably x>y. Preferably in the polymer of formula I x is from 0.5 to 0.9 and y is from 0.5 to 0.1. Very preferably in the polymer of formula I x is from 0.69 to 0.84 and y is from 0.31 to 0.16.

In a preferred photodiode embodiment of the present invention the first HSL further comprises a conductive polymer in addition to the fluoropolymer of formula I. In another preferred photodiode embodiment of the present invention the photodiode contains a second HSL containing a conductive polymer.

The conductive polymer preferably comprises, more preferably consists of, one or more repeating units selected from the group consisting of the following formulae RU1 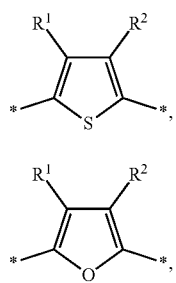
RU2 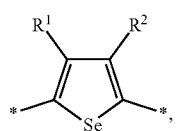
RU3 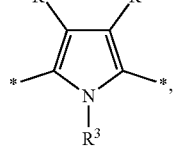
RU4 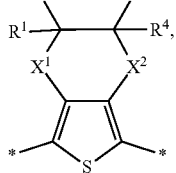
RU5 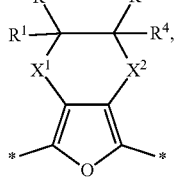
RU6 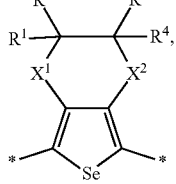
RU7 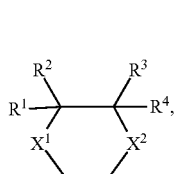
RU8 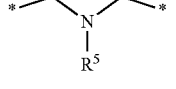
RU9 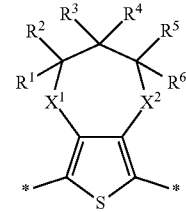
RU10 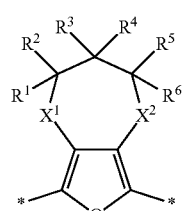
RU11 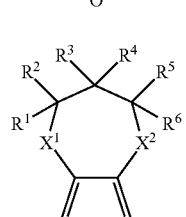
RU12 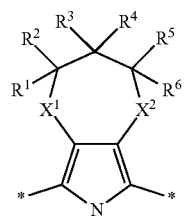
RU13 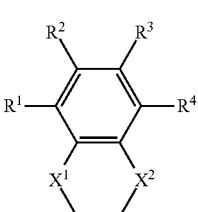
RU14 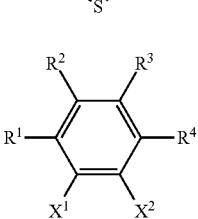

-continued
RU15
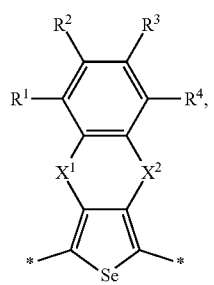
RU16
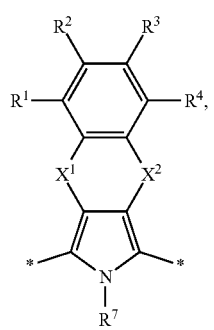
RU17
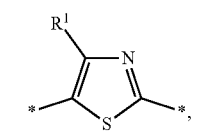
RU18
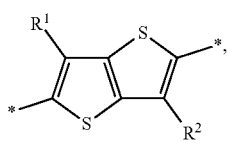
RU19
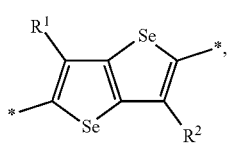
RU20
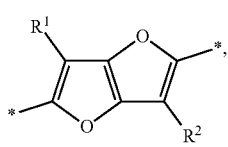
RU21
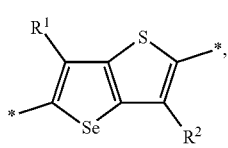
RU22
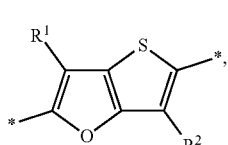
RU23
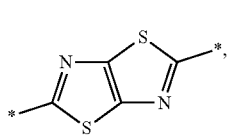
-continued
RU24
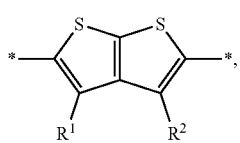
RU25
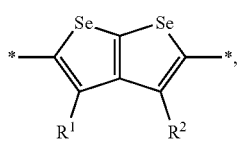
RU26
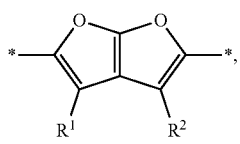
RU27
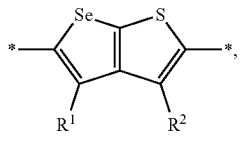
RU28
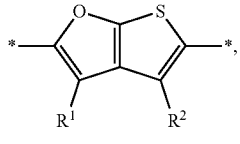
RU29
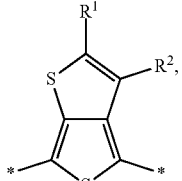
RU30
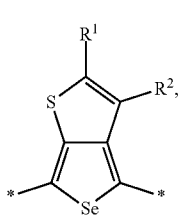
RU31
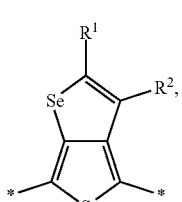
RU32
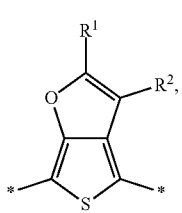

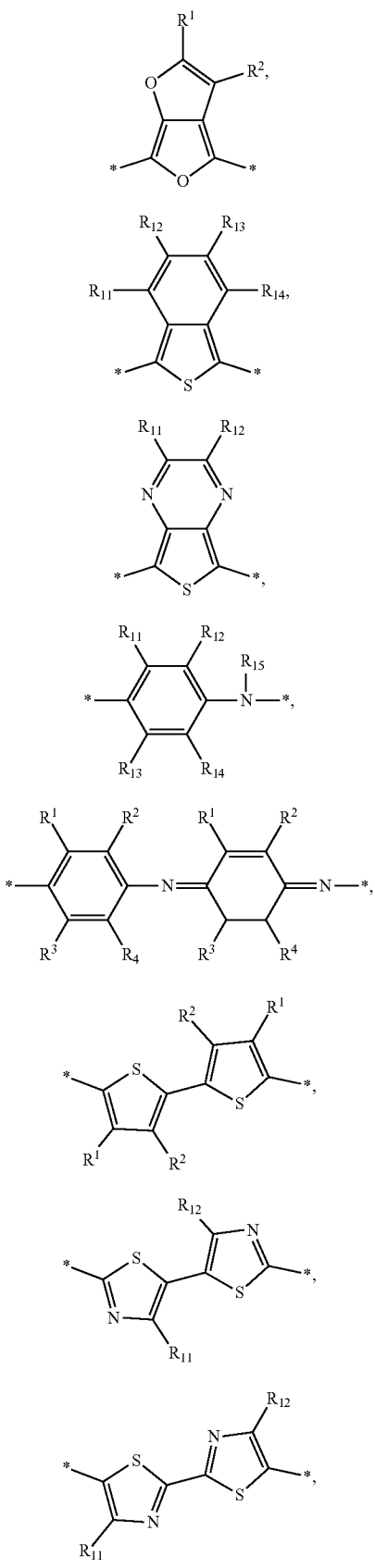

wherein the individual radicals, independently of each other and on each occurrence identically or differently, have the following meanings $X^1$, $X^2$ is O, S or Se, $R^{1-6}$ is selected from the group consisting of H, F, Cl, CN, or straight-chain, branched or cyclic alkyl with 1 to 30, preferably 1 to 20, C atoms, in which one or more $CH_2$ groups are each optionally replaced by —O—, —S—, —C(=O)—, —C(=S)—, —C(=O)—O—, —O—C(=O)—, —$NR^0$—, —Si $R^0$ $R^{00}$—, —$CF_2$—, —$CR^0$=$CR^{00}$—, —$CY^1$=$CY^2$— or —C≡C— in such a manner that O and/or S atoms are not linked directly to one another, and in which one or more H atoms are each optionally replaced by F, Cl, Br, I or CN, and in which one or more $CH_2$ or $CH_3$ groups are each optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, optionally contains fused rings, and is unsubstituted or substituted by one or more identical or different groups L, $R^0$, $R^{00}$ is selected from the group consisting of H and straight-chain or branched alkyl with 1 to 20, preferably 1 to 12, C atoms that is optionally fluorinated, $X^0$ is halogen, preferably F or Cl.

Very preferably, the conductive polymer preferably comprises, more preferably consists of, one or more repeating units selected from the group consisting of formulae RU1, RU5, RU9, RU13, RU17, RU18, RU23, RU24, RU29, RU34, RU35, RU36, RU37, RU38, RU39 and RU40, very preferably selected from the group consisting of formulae RU1, RU5, RU9, RU13, RU18, RU29, RU34, RU36 and RU37.

Very preferably, the conductive polymer preferably comprises, more preferably consists of, one or more repeating units selected from the group consisting of the following formulae

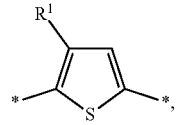
RU1a

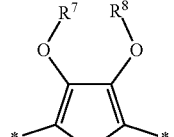
RU1b

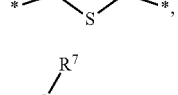
RU1c

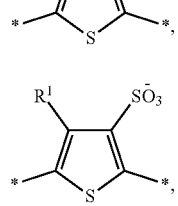
RU1d

RU5a
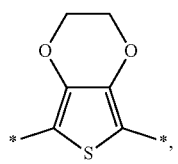

RU5b
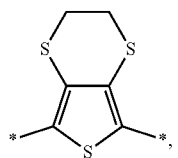

RU5c
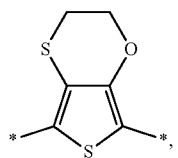

RU5d
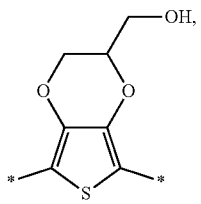

RU5e
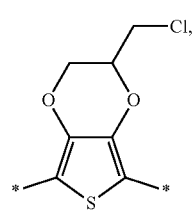

RU9a
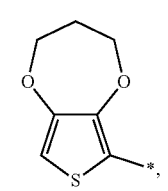

RU9b
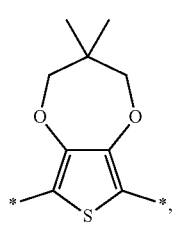

RU9c
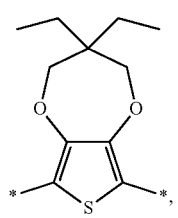

RU13a
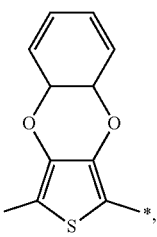

RU18a
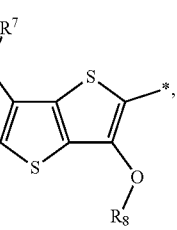

RU29a
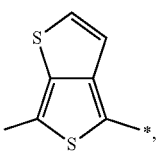

RU29b
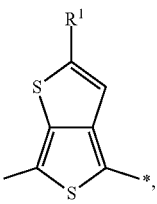

RU34a
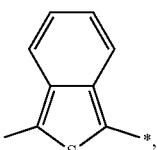

RU36a
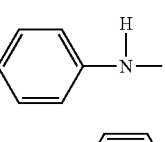

RU37a
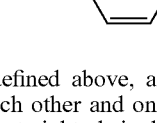

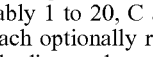

wherein $R^1$ is as defined above, and $R^7$ and $R^8$ denote, independently of each other and on each occurrence identically or differently, straight-chain, branched or cyclic alkyl with 1 to 30, preferably 1 to 20, C atoms, in which one or more H atoms are each optionally replaced by F.

In a preferred embodiment the polymer consists of only one type of repeating units selected from the group consisting of formulae RU1, RU5, RU9, RU13, RU17, RU18, RU23, RU24, RU29, RU34, RU35, RU36, RU37, RU38, RU39 and RU40, very preferably selected from the group consisting of formulae RU1, RU5, RU9, RU13, RU18, RU29, RU34, RU36 and RU37, more preferably selected from the group consisting of formulae RU1a, RU1b, RU1c, RU1d, RU5a, RU5b, RU5c, RU5d, RU9a, RU9b, RU9c, RU13a, RU18a, RU29a, RU29b, RU34a, RU36a and RU37a, most preferably of formula RU1a, RU5a, RU5b, RU29a or RU29b.

If the conductive polymer is polyaniline, it is preferably of the following formula

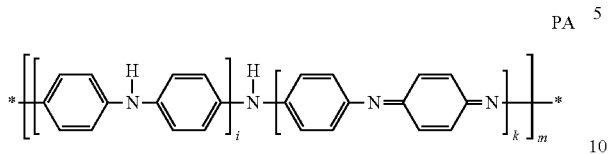

PA wherein i+k=1, i is 0–1, k is 0–1, and m equals half the degree of polymerization. Very preferably i is1 and k is0, or i is 0 and k is1, or both i and k denote 0.5.

In a preferred embodiment of the present invention $R^{1-6}$ in the units of formula RU1-RU40 and their subformulae are H.

In another preferred embodiment of the present invention at least one of $R^{1-6}$ in the units of formula RU1-RU40 and their subformulae is different from H.

Preferably, in the units of formula RU1-RU40 and their subformulae $R^{1-6}$, when being different from H, are each independently selected from the group consisting of F, Cl or straight-chain or branched alkyl, alkoxy, sulfanylalkyl, sulfonylalkyl, alkylcarbonyl, alkoxycarbonyl and alkylcarbonyloxy, each having 1 to 20 C atoms and being unsubstituted or substituted by one or more F atoms.

Further preferably, in the units of formula RU1-RU40 and their subformulae $R^{1-6}$, when being different from H, are each independently selected from aryl or heteroaryl, each of which is optionally substituted with one or more groups L as defined in formula IA and has 5 to 20 ring atoms.

Preferred aryl and heteroaryl groups $R^{1-6}$ are each independently selected from the group consisting of the following formulae

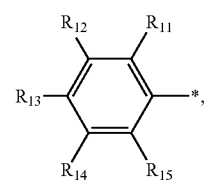 C1

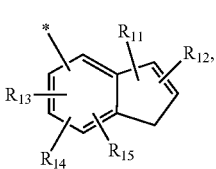 C2

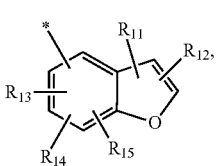 C3

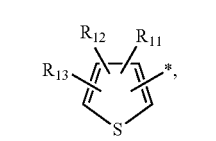 C4

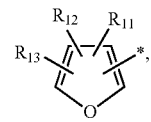 C5

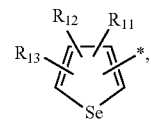 C6

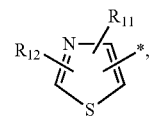 C7

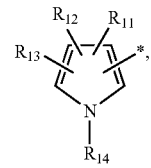 C8

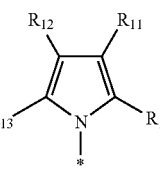 C9

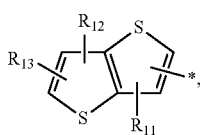 C10

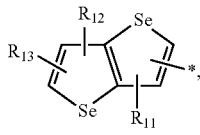 C11

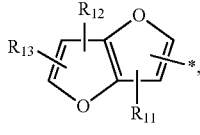 C12

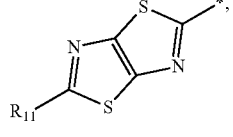 C13

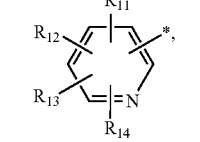 C14

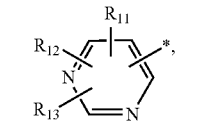 C15

-continued

C16 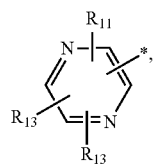

C17 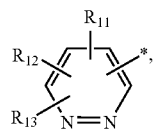

C18 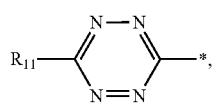

C19 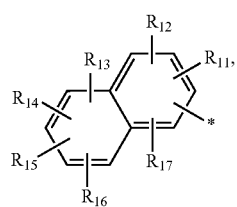

C20 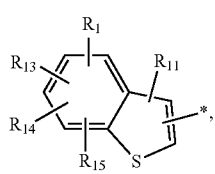

C21 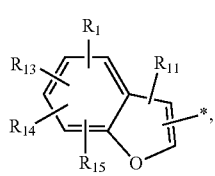

C22 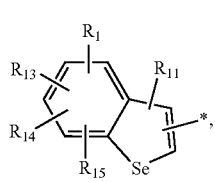

C23 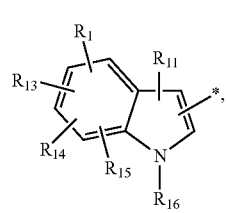

C24 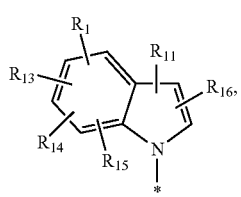

-continued

C25 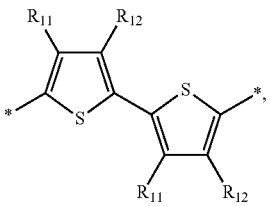

C26 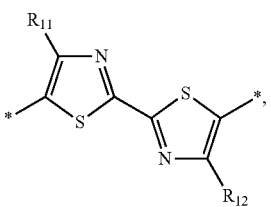

C27 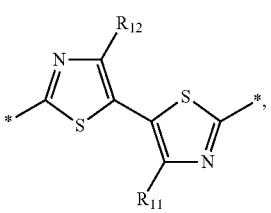

wherein $R^{11-17}$, independently of each other, and on each occurrence identically or differently, denote H or have one of the meanings given for L in formula IA or one of its preferred meanings as given above and below.

Very preferred aryl and heteroaryl groups $R^{1-6}$ are each independently selected from the group consisting of the following formulae C1-1 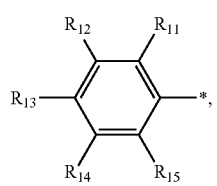

C4-1 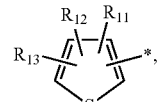

C5-1 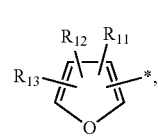

C7-1 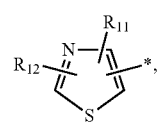

C10-1 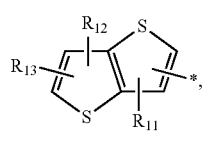

wherein $R^{11-15}$ are as defined above. Most preferred aryl and heteroaryl groups $R^{1-6}$ are each independently selected from the group consisting of formulae SUB7 to SUB18 as defined above.

In another preferred embodiment, in the units of formula RU1-RU40 and their subformulae $R^{1-6}$ are elected from straight-chain, branched or cyclic alkyl with 1 to 30, preferably 2 to 30, more preferably 2 to 24, most preferably 2 to 16 C atoms, in which one or more $CH_2$ or $CH_3$ groups are replaced by a cationic or anionic group.

The cationic group is preferably selected from the group consisting of phosphonium, sulfonium, ammonium, uronium, thiouronium, guanidinium and heterocyclic cations such as imidazolium, pyridinium, pyrrolidinium, triazolium, morpholinium and piperidinium cation.

Preferred cationic groups are selected from the group consisting of tetraalkylammonium, tetraalkylphosphonium, N-alkylpyridinium, N,N-dialkylpyrrolidinium, 1,3-dialkylimidazolium, wherein "alkyl" preferably denotes a straight-chain or branched alkyl group with 1 to 12 C atoms and very preferably is selected from the group consisting of formulae SUB1-6.

Further preferred cationic groups are selected from the group consisting of the group consisting of the following formulae

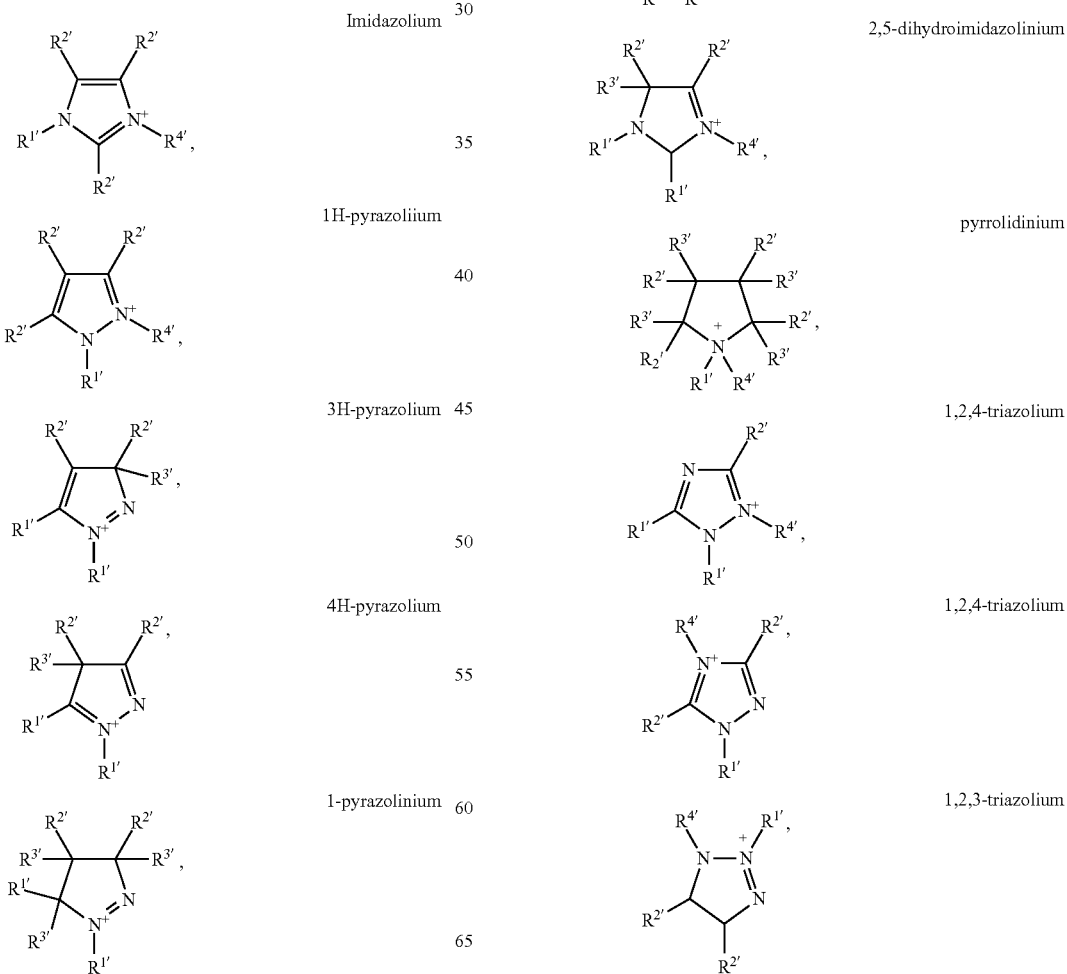

-continued
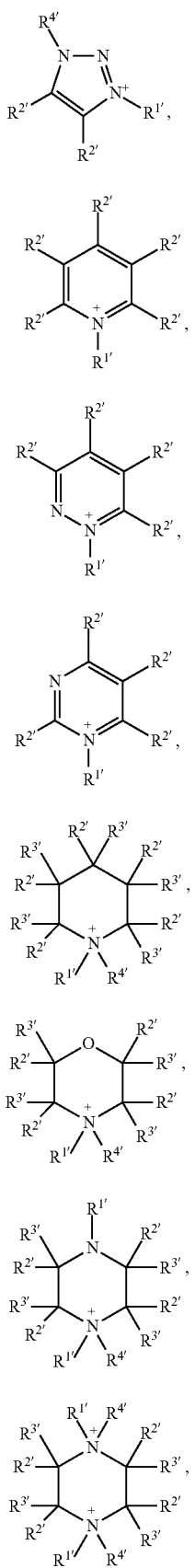
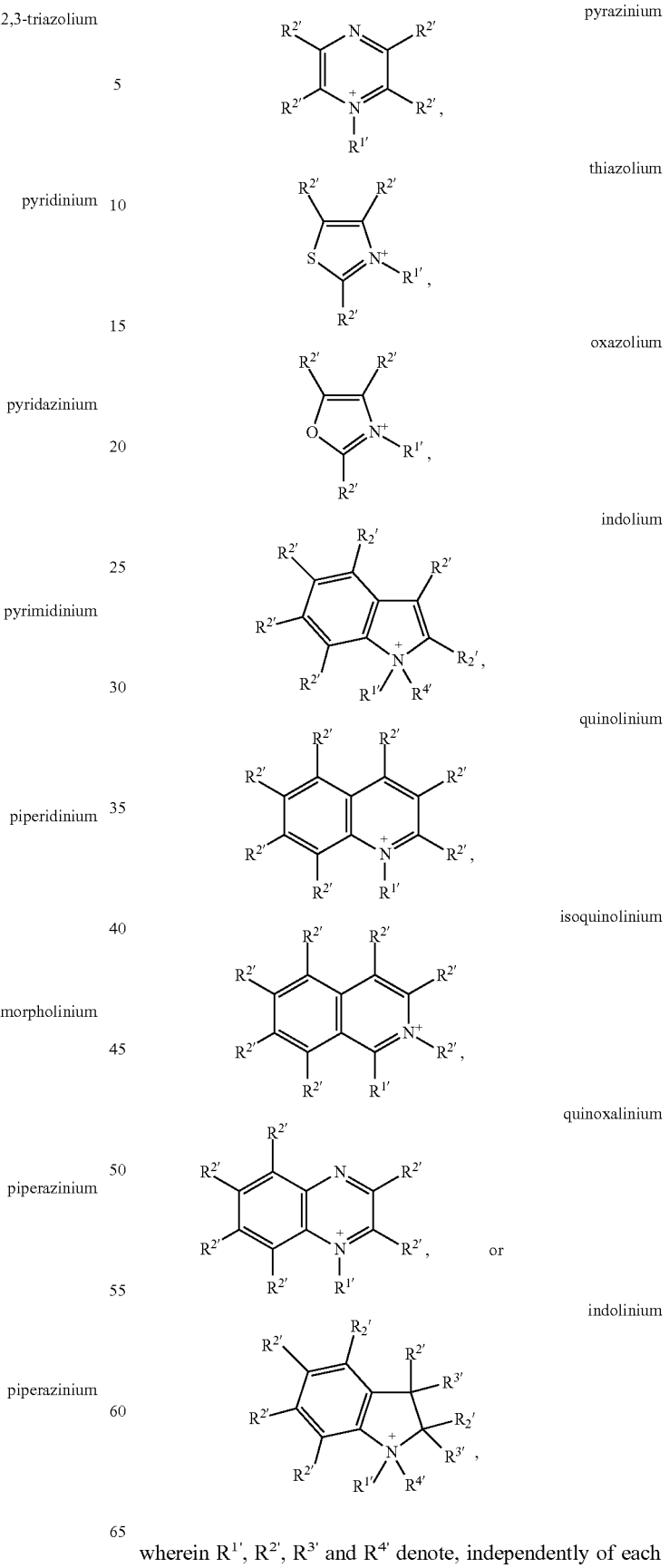
wherein R¹', R²', R³' and R⁴' denote, independently of each other, H, a straight-chain or branched alkyl group with 1 to 12 C atoms or non-aromatic carbo- or heterocyclic group or an aryl or heteroaryl group, each of the aforementioned groups having 3 to 20, preferably 5 to 15, ring atoms, being mono- or polycyclic, and optionally being substituted by one or more identical or different substituents L as defined above, or denote a link to the respective group $R^{1-10}$.

In the above cationic groups of the above-mentioned formulae any one of the groups $R^{1'}$, $R^{2'}$, $R^{3'}$ and $R^{4'}$(if they replace a $CH_3$ group) can denote a link to the respective group $R^{1-10}$, or two neighbored groups $R^{1'}$, $R^{2'}$, $R^{3'}$ or $R^{4'}$ (if they replace a $CH_2$ group) can denote a link to the respective group R1.

The anionic group is preferably selected from the group consisting of borate, imide, phosphate, sulfonate, sulfate, succinate, naphthenate or carboxylate, very preferably from phosphate, sulfonate or carboxylate, most preferably from sulfonate.

Especially preferably the conductive polymer is poly(3,4-ethylenedioxy-thiophene) (PEDOT), poly(3,4-ethylenedithiathiophene) (PEDTT) or poly(3-alkyl)thiophene (P3AT) wherein "alkyl" is C1-12 alkyl or poly(thieno[3,4-b]thiophene) (PTT).

The invention also relates to a composition comprising a fluoropolymer of formula I, a conductive polymer as described above and below, and one or more solvents, wherein the composition does not contain poly(styrenesulfonic acid) or a poly(styrenesulfonate).

The invention further relates to a polymer blend which contains, preferably consists of, a fluoropolymer of formula I and a conductive polymer, and which does not contain poly(styrenesulfonic acid) or a poly(styrenesulfonate). The polymer blend according to this invention preferably contains only solid components.

Preferably the conductive polymer in the composition or polymer blend according to the present invention is selected from the group consisting of the preferred conductive polymers as described above, and very preferably is PEDOT, PEDTT, P3AT or PTT as defined above.

In a first preferred embodiment, the composition comprises a fluoropolymer of formula I, a conductive polymer as described above and below, water, and optionally one or more organic solvents that are water-miscible or soluble up to a certain concentration in water.

Very preferably, the composition according to this first preferred embodiment contains water and one or more solvents selected from the group consisting of the following groups:
a) alcohols, for example methanol, ethanol, 1-propanol, 2-propanol, 1-butanol, 2-butanol, 1-pentanol, 2-pentanol, 1-octanol, or glycerol;
b) ethers, for example tetrahydrofuran, methyl-tert-butyl-ether, ethylene glycol, diethylene glycol or triethylene glycol;
c) lactones, for example butyrolactone, valerolactone;
d) amides or lactams, for example caprolactam, N-methylcaprolactam, N— N-dimetylacetamid, N-methyl-acetamide, N,N-dimethylformamide, N-methylformamide, N-methylformanilide, N-methylpyrrolidone, N-octylpyrrolidone, pyrrolidone;
e) sulphones or sulphoxides, for example sulpholane or dimethylsulphoxide;
f) aliphatic nitriles, for example acetonitrile, benzonitrile, or methoxyacetonitrile;
g) aliphatic carboxylic acid amides, for example methyl acetamide, dimethyl acetamide or dimethyl formamide;
h) ketones, for example acetone, methyl ethyl ketone, 1-butanone, 2-butanone, 3-methyl-2-butanone, 1-pentanone, 2-pentanone, 3-pentanone, 2-methly-3-pentanone, 3-methyl-2-pentanone, cyclopentanone, ethyl acetoacetate or methyl t-butyl ketone;
i) esters, for example methyl acetate, ethyl acetate, propyl acetate or butyl acetate;
j) formates, for example ethyl formate, propyl formate, isopropyl formate, or tertbutyl formate.

Preferably the composition is an aqueous dispersion comprising a fluoropolymer of formula I, optionally a conductive polymer as described above and below, water, and preferably in addition one or more organic solvents that are water-miscible or soluble up to a certain concentration in water and are very preferably selected from the groups comprising a) to i) as listed above. Very preferred solvents are alcohols, glycols, ketones, formates, esters, sulphoxides and/or lactones.

In a second preferred embodiment, the composition comprises a fluoropolymer of formula I, optionally a conductive polymer as described above and below, and one or more solvents that are exclusively selected from organic solvents, i.e. excluding water.

Very preferably, the composition according to second first preferred embodiment contains one or more solvents selected from the following groups:
a) alcohols, for example methanol, ethanol, 1-propanol, 2-propanol, 1-butanol, 1-octanol, and glycerol;
b) ethers, for example tetrahydrofuran, methyl-tert-butyl-ether, ethylene glycol, diethylene glycol and triethylene glycol;
c) lactones, for example butyrolactone, valerolactone;
d) amides or lactams, for example caprolactam, N-methylcaprolactam, N— N-dimetylacetamid, N-methyl-acetamide, N,N-dimethylformamide, N-methylformamide, N-methylformanilide, N-methylpyrrolidone, N-octylpyrrolidone, pyrrolidone;
e) sulphones or sulphoxides, for example sulpholane or dimethylsulphoxide;
f) aliphatic nitriles, for example acetonitrile;
g) aliphatic carboxylic acid amides, for example methyl acetamide, dimethyl acetamide or dimethyl formamide;
h) ketones, for example acetone, methyl ethyl ketone or methyl t-butyl ketone;
i) esters, for example methyl acetate, ethyl acetate or butyl acetate.
j) linear, branched or cyclic aliphatic hydrocarbons, for example, pentane, hexane, heptane, octane, petroleum ether, cyclohexane, methyl cyclohexane or cycloheptane
k) aromatic hydrocarbons, for example benzene, toluene or xylene;
l) halogenated hydrocarbons, for example dichloromethane, chloroform, tetrachloromethane, trichloroethane or trichloroethene;
m) halogenated aromatic hydrocarbons, for example chlorobenzene.

In a preferred embodiment of the present invention the conductive polymer, or the composition or polymer blend comprising it, are prepared in situ from one or more corresponding monomers, or from a composition comprising the corresponding monomer(s), in an oxidative polymerization process.

In a preferred embodiment the composition for preparing the conductive polymer further comprises the fluoropolymer of formula I. In another preferred embodiment the fluoropolymer of formula I is combined with the conductive polymer after the oxidative polymerization process.

Preferably the oxidative polymerization process is carried out by reacting the corresponding monomer(s) with one or more oxidizing agents in the presence of a catalyst, and optionally in the presence of the fluoropolymer of formula I, preferably in an aqueous solution or dispersion.

The term "corresponding monomer(s)" means the monomer(s) forming the conductive polymer. For example, the corresponding monomer for a conductive polymer, which consists of units selected from the group consisting of formulae RU1-RU40 and their subformulae RU1a-RU37a, is a compound selected from the group consisting of formulae RU1-RU36, RU38, RU39 and RU40, or from formulae RU1a to RU36a wherein the asterisks denote H atoms. In case of polyaniline, which consists of repeat units of formulae RU36 and/or RU37, the corresponding monomer is aniline of formula RU36 wherein the asterisks denote H atoms. The corresponding monomer for preparing PEDOT, PEDTT, P3AT or PTT is 3,4-ethylenedioxythiophene, 3,4-ethylene-dithiothiophene, 3-alkylthiophene or thieno[3,4-b]thiophene, respectively. In case of a copolymer two or more distinct monomers are reacted together.

Preferably the oxidative polymerization is carried out by providing an aqueous solution or dispersion containing one or more corresponding monomers and optionally a fluoropolymer of formula I, and adding an oxidizing agent and optionally a catalyst.

Some compounds can also act both as oxidizing agent and as catalyst, so that, alternatively to adding an oxidizing agent and a catalyst, it is also possible to add only one compound that serves both as oxidizing agent and catalyst.

Alternatively, it is also possible to add only an oxidizing agent without a catalyst.

Preferred compounds for use as oxidizing agents and/or catalysts are for example those that are suitable for the oxidative polymerization of pyrrole. Further preferred compounds for use as oxidizing agents and/or catalysts are selected from the following groups:

O1) organic peroxides, like for example tert-butyl peroxide, diisobutyryl peroxide, di-n-propyl peroxydicarbonate, didecanoyl peroxide, dibenzoyl peroxide, tert-butyl peroxybenzoate, di-tert-amyl peroxide, O2) organic azo compounds, like for example, 2,2'-azodiisobutyronitrile, O3) inorganic salts, like for example sodium persulfate, hydroxymethanesulfinic acid monosodium dihydrate, sodium peroxymonosulfuric, sodium and potassium hypochlorite, sodium perborate, sodium bismuthate, sodium chlorate and potassium chlorate.

O4) metal based salt or organometallic complex with an oxidation potential greater than the monomer of the conducting polymer.

O5) Fe(III) salts of inorganic acids, like for example $Fe(Cl)_3$ or $Fe(ClO_4)_3$, O6) Fe(III) salts of inorganic acids comprising organic radicals, like for example Fe(III) salts of sulphuric acid hemiesters of $C_1$-$C_{20}$ alkanols or Fe(III) salts of lauryl sulphate O7) Fe(III) salts of organic acids, like for example $C_1$-$C_{20}$ alkyl sulphonic acids such as methane- and dodecanesulphonic acid; aliphatic $C_1$-$C_{20}$ carboxylic acids such as 2-ethylhexyl carboxylic acid; aliphatic perfluorocarboxylic acids, such as trifluoroacetic acid and perfluorooctanoic acid; aliphatic dicarboxylic acids such as oxalic acid; aromatic sulphonic acids optionally substituted with $C_1$-$C_{20}$ alkyl groups, such as benzenesulphonic acid, p-toluenesulphonic acid and dodecylbenzenesulphonic acid, O8) a metal based salt or organometallic complex with an oxidation potential greater than the monomer of the conducting polymer.

Very preferably the oxidative polymerization is carried out by adding to the solution or dispersion comprising the corresponding monomer one or more compounds selected from groups consisting of O1-O4 as oxidizing agent and adding one or more compounds selected from groups consisting of O5-O9 as catalyst.

The above oxidizing agents are inexpensive and easy-to-handle. The Fe(III) salts of organic acid have the big applicational advantage that they are partially or completely soluble in organic solvents and in particular in water-immiscible organic solvents.

The polymer blend according to the present invention containing the polymer of formula I and the conductive polymer is preferably prepared by a process for preparing a composition, solution or dispersion as described above and below, followed by removal of the solvents.

Preferably the composition or polymer blend according to the present invention further comprises one or more of the following components:
one or more ionic or zwitterionic species,
one or more additional polymers other than those of formula I or PSS,
one or more additives selected from the group consisting of binders, crosslinking agents, viscosity modifiers, pH regulators, additives which increase the conductivity, antioxidants, additives which modify the work function, auxiliary solvents for homogeneous mixing of the individual components, or a mixture of two or more of the aforementioned additives.

Preferred surfactants are selected from the group consisting of the following:

ZONYL™ FSN (a 40 weight percent strength solution of $F(CF_2CF_2)_{1-9}CH_2CH_2O(CH_2CH_2O)_xH$ in a 50 weight percent strength aqueous solution of isopropanol, wherein x=0 to about 25/marketed by DuPont); ZONYL™ FSN 100 ($F(CF_2CF_2)_{1-9}CH_2CH_2O$ $(CH_2CH_2O)_xH$, wherein x=0 to about 25/marketed by DuPont); ZONYL™ FS300 (a 40 weight percent strength aqueous solution of a fluoro-surfactant/marketed by DuPont);

ZONYL™ FSO (a 50 weight percent strength solution of the ethoxylated non-ionic fluoro-surfactant of the formula $F(CF_2CF_2)_{1-7}CH_2CH_2O(CH_2CH_2O)_yH$, wherein y=0 to about 15, in a 50 weight percent strength aqueous solution of ethylene glycol/marketed by DuPont);

ZONYL™ FSO 100 (a mixture of ethoxylated non-ionic fluoro-surfactant of the formula $F(CF_2CF_2)_{1-7}$ $CH_2CH_2O(CH_2CH_2O)_yH$, wherein y=0 to about 15/marketed by DuPont);

ZONYL™ 7950 (a fluoro-surfactant from DuPont);

ZONYL™ FSA (a 25 weight percent strength solution of $F(CF_2CF_2)_{1-8}CH_2CH_2S$ $CH_2CH_2COOLi$ in a 50 weight percent strength aqueous solution of isopropanol/marketed by DuPont);

ZONYL™ FSE (a 14 weight percent strength solution of $[F(CF_2CF_2)_{1-7}CH_2CH_2O]_xP(O)(ONH_4)_y$, wherein x=1 or 2, y=2 or 1 and x+y=3, in a 70 weight percent strength aqueous solution of ethylene glycol/marketed by DuPont);

ZONYL™ FSJ (a 40 weight percent strength solution of a mixture of $[F(CF_2CF_2)_{1-7}CH_2CH_2O]_xP(O)(ONH_4)_y$, wherein x=1 or 2, y=2 or 1 and x+y=3, and a hydrocarbon surfactant in a 25 weight percent strength aqueous solution of isopropanol/marketed by DuPont);

ZONYL™ FSP, a 35 weight percent strength solution of [F(CF$_2$CF$_2$)$_{1-7}$CH$_2$CH$_2$O]$_x$P(O)(ONH$_4$)$_y$, wherein x=1 or 2, y=2 or 1 and x+y=3, in a 69.2 weight percent strength aqueous solution of isopropanol/marketed by DuPont;

ZONYL™ UR ([F(CF$_2$CF$_2$)$_{1-7}$CH$_2$CH$_2$O]$_x$P(O)(OH)$_y$, wherein x=1 or 2, y=2 or 1 and x+y=3/marketed by DuPont);

ZONYL™ TBS: a 33 weight percent strength solution of F(CF$_2$CF$_2$)$_{3-8}$CH$_2$CH$_2$SO$_3$H in a 4.5 weight percent strength aqueous solution of acetic acid/marketed by DuPont); TEGOGLIDE™ 410 (a polysiloxane polymer copolymer surfactant/marketed by Goldschmidt);

TEGOWET™ (a polysiloxane/polyester copolymer surfactant/marketed by Goldschmidt);

FLUORAD™ FC431 (CF$_3$(CF$_2$)$_7$SO$_2$(C$_2$H$_5$)N—CH$_2$CO—(OCH$_2$CH$_2$)$_n$OH/marketed by 3M);

FLUORAD™ FC126 (a mixture of the ammonium salts of perfluorocarboxylic acids/marketed by 3M);

FLUORAD™ FC430 (a 98.5 percent strength active aliphatic fluoro-ester surfactant from 3M);

Polyoxyethylene 10-lauryl ether;

SILWET™ H212 (copolymer from Momentive);

SURFINOL™ 104 (acetylenic diol from Air Products);

DYNOL™ 604 (Air Products);

TRITON™-X-100 (4-(1,1,3,3-tetramethylbutyl)phenylpolyethylene glycol from Dow);

TRITON™ XNA45S (Dow);

TEGO™ Twin 4000 and TEGO™ Twin 4100 ("gemini surfactants" from Evonik);

Trialkoxysilanes, like for example 3-glycidoxypropyltrialkoxysilane, 3-aminopropyltriethoxysilane; 3-mercaptopropyltrimethoxysilane, 3-methacryloxypropyltrimethoxysilane, vinyltrimethoxysilane, octyltriethoxysilane.

Preferred additional polymers, beyond the polymer of formula I and the conductive polymer, are selected from the following groups:

P1) functionalized polyketones;
P2) fluorinated or perfluorinated sulphonic acids;
P3) polyvinyl alcohols, polyvinylpyrrolidones, polyvinyl chlorides, polyvinyl acetates, polyvinyl butyrates;
P4) polyacrylic acid esters, polyacrylic acid amides, polymethacrylic acid esters, polymethacrylic acid amides, polyacrylonitriles, styrene/acrylic acid ester, vinyl acetate/acrylic acid ester and ethylene/vinyl acetate copolymers;
P5) polyethers;
P6) polyesters;
P7) polyurethanes;
P8) polyamides;
P9) polyimides;
P10) non-functionalized polyketones;
P11) polysulphones;
P12) melamine-formaldehyde resins;
P13) epoxy resins;
P14) silicone resins; and
P15) celluloses.

The concentration of the polymer of formula I in the composition is preferably 0.1 to 35%, particularly preferably 0.5 to 25% and most preferably 1.0 to 15% by weight.

The concentration of the conductive polymer in the composition is preferably 0.01 to 10%, very preferably 0.05 to 5% and most preferably 0.1 to 3% by weight.

The total concentration of the solvents in the composition is preferably 50 to <100%, particularly preferably 68 to 99% and most preferably 78 to 97% by weight percent.

The concentration of the further additives in the composition is preferably 0 to 20%, particularly preferably 0.5 to 17% and most preferably 1 to 15% by weight.

The concentration of the surfactant in the composition is preferably 0 to 5%, particularly preferably 0.05 to 2% and most preferably 0.1 to 1.5% by weight.

A preferred composition according to the present invention contains a polymer of formula I, a conductive polymer, one or more solvents, one or more further additives like for example an auxiliary solvent such as 2-propanol, and one or more surfactants, all in the aforementioned concentration ranges, and wherein the composition does not contain poly(styrenesulfonic acid) or a poly(styrenesulfonate).

Examples of suitable and preferred binders for use in the composition containing the polymer of formula I include insulating binders and semiconducting binders, or mixtures thereof. Preferably the binders are selected from the group consisting of polymeric binders, very preferably from hydrophilic polymers.

Examples of suitable and preferred insulating polymeric binders are those selected from the above groups P1) to P15).

The binder can also be selected from the group of cross-linkable binders, like e.g. acrylates, epoxies, vinylethers, thiolenes etc. The binder can also be mesogenic or liquid crystalline.

Examples of suitable and preferred semiconducting polymeric binders include homopolymers and copolymers (including block copolymers) containing arylamine groups, preferably poly(triarylamine).

The weight ratio of a polymeric binder to the combined amounts of the polymer of formula I and the conductive polymer is preferably in the range of 10000:1 to 1:10000, particularly in the range of 1:5 to 1:5000 and more preferably in the range of 1:2 to 1:1000.

A photodiode according to a first preferred embodiment of the present invention (100) is exemplarily and schematically illustrated in FIG. 1a, and comprises the following sequence of layers from bottom to top:

optionally a first substrate (110),
a hole collecting electrode (120),
a first hole selective layer (HSL) (130), which is for example a hole transport layer (HTL) or electron blocking layer (EBL),
a photoactive layer (140), preferably containing an n-type organic semiconducting (OSC) compound and a p-type OSC compound, which are preferably forming a bulk heterojunction (BHJ),
optionally an electron selective layer (ESL) (150), which is for example an electron transport layer (ETL) or hole blocking layer (HBL),
an electron collecting electrode (160),
optionally a second substrate (170), wherein the HSL 130 comprises a fluoropolymer of formula I as described above and below, or a composition as described above and below.

Figure 1B:
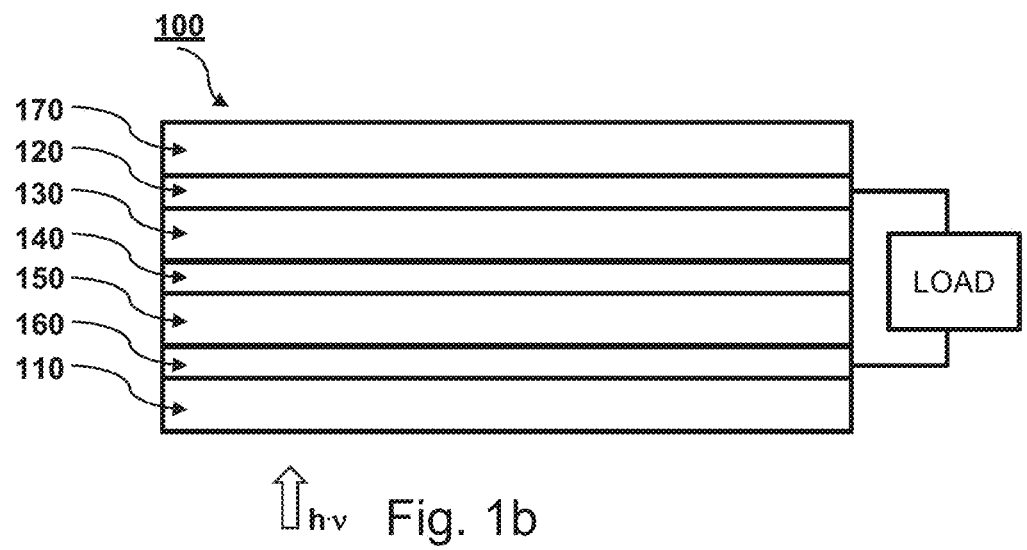

A photodiode according to a second preferred embodiment of the present invention (100) is exemplarily and schematically illustrated in FIG. 1b, and comprises the following sequence of layers from bottom to top:

optionally a first substrate (110),
an electron collecting electrode (160), optionally an electron selective layer (ESL) (150), which is for example an electron transport layer (ETL) or hole blocking layer (HBL), a photoactive layer (140), preferably containing an n-type organic semiconducting (OSC) compound and a p-type OSC compound, which are preferably forming a BHJ, a first hole selective layer (HSL) (130), which is for example a hole transport layer (HTL) or electron blocking layer (EBL), a hole collecting electrode (120), optionally a second substrate (170), wherein the HSL 130 comprises a fluoropolymer of formula I as described above and below, or a composition as described above and below.

In the photodiodes according to the first and second preferred embodiment the first HSL layer may further comprise a conductive polymer as described above and below.

In addition or alternatively thereto, in an photodiode according to further preferred embodiments of the present invention, the photodiode further comprises a second HSL comprising a conductive polymer, wherein said second HSL is located between the photoactive layer and the hole collecting electrode, and is preferably located between the first HSL and the hole collecting electrode. Preferably in these preferred embodiments the first HSL layer does not contain, in addition to the fluoropolymer of formula I, a conductive polymer as described above and below.

Figure 2A:
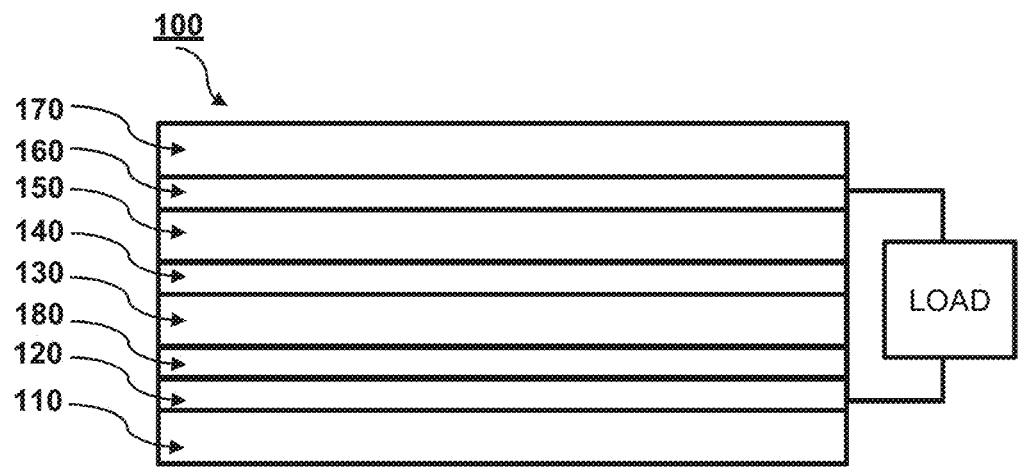

Thus, a photodiode according to a third preferred embodiment invention (100) is exemplarily and schematically illustrated in FIG. 2*a*, and comprises the following sequence of layers:

optionally a first substrate (110), a hole collecting electrode (120), a second hole selective layer (HSL) (180), which comprises a conductive polymer, a first hole selective layer (HSL) (130), which is for example a hole transport layer (HTL) or electron blocking layer (EBL), a photoactive layer (140), preferably containing an n-type organic semiconducting (OSC) compound and a p-type OSC compound, which are preferably forming a BHJ, optionally an electron selective layer (ESL) (150), which is for example an electron transport layer (ETL) or hole blocking layer (HBL), an electron collecting electrode (160), optionally a second substrate (170), wherein the first HSL 130 comprises a fluoropolymer of formula I as described above and below, or a composition as described above and below, and wherein preferably the first HSL 130 and the composition do not contain, in addition to the polymer of formula I, a conductive polymer.

Figure 2B:
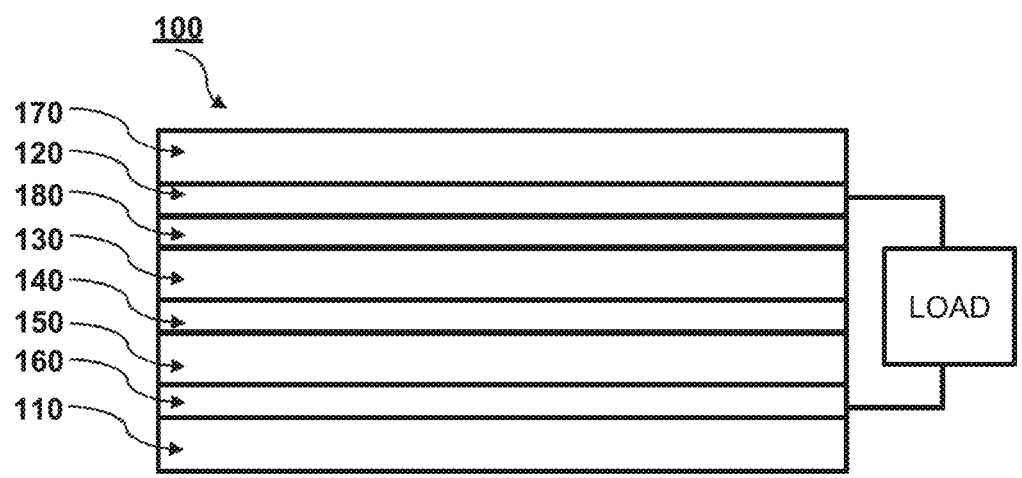

A photodiode according to a fourth preferred embodiment of the present invention (100) is exemplarily and schematically illustrated in FIG. 2*b*, and comprises the following sequence of layers from bottom to top:

optionally a first substrate (110), an electron collecting electrode (160), optionally an electron selective layer (ESL) (150), which is for example an electron transport layer (ETL) or hole blocking layer (HBL), a photoactive layer (140), preferably containing an n-type organic semiconducting (OSC) compound and a p-type OSC compound, which are preferably forming a BHJ, a first hole selective layer (HSL) (130), which is for example a hole transport layer (HTL) or electron blocking layer (EBL), a second hole selective layer (HSL) (180), which comprises a conductive polymer, a hole collecting electrode (120), optionally a second substrate (170), wherein the first HSL 130 comprises a fluoropolymer of formula I as described above and below, or a composition as described above and below, and wherein preferably the first HSL 130 and the composition do not contain, in addition to the polymer of formula I, a conductive polymer.

Preferably the conductive polymer in the second HSL 180 is selected such that it has a work function that is between the work function of the first HSL 130 and the work function of the hole collecting electrode 120 (i.e. which is higher than the work function than the first HSL 130 but lower than the work function of the hole collecting electrode), so that the work function increases steadily from the photoactive layer 140 through the first HSL 130 and the second HSL 180 to the hole collecting electrode 120. Very preferably the second HSL 180 contains a conductive polymer which is PEDOT or PEDOT:PSS.

The layer sequence in a photodiode according to the first and third preferred embodiment is also referred to as "normal stack". The layer sequence in a photodiode according to the second and fourth preferred embodiment is also referred to as "inverted stack".

In a photodiode stack according to the present invention, the direction of incoming light is usually from bottom to top, as depicted in FIG. 1*a+b* and FIG. 2*a+b*. In the case were two transparent electrodes are used, the light can enter from either side of the device.

In photodiodes like those according to the present invention the hole collecting electrode 120 is usually serving as anode and the electron collecting electrode 160 is usually serving as cathode.

The overall layer stack in the photodiode may be encapsulated within a flexible or rigid casing.

In general, during use, light impinges on the surface of substrate 110, and passes through substrate 110, electrode 120 and HSL 130 (and 180 if present). The light then interacts with the photoactive layer 140, causing electrons to be transferred from the electron donor material (e.g. a conjugated polymer) to the electron acceptor material (e.g. a substituted fullerene or a non-fullerene acceptor (NFA). The electron donor material transfers holes through HSL 130 (and 180 if present) to electrode 120, and the electron acceptor material transfers electrons, optionally through ETL 150, to electrode 160. Electrodes 120 and 160 are in electrical connection via an external load so that electrons pass from electrode 160 through the load to electrode 120.

In a preferred embodiment the photodiode 100 comprises a first transparent or semi-transparent electrode 120 or 160 on a transparent or semi-transparent substrate 110 on one side of the photoactive layer, and a second metallic or semi-transparent electrode 120 or 160 on the other side of the photoactive layer, wherein one of the electrodes serves as anode and the other electrode serves as cathode.

In the first and third preferred embodiment photodiode 100 preferably includes an anode as bottom electrode 120 and a cathode as top electrode 160 (normal stack). In the second and fourth preferred embodiment photodiode 100 preferably includes a cathode as bottom electrode 120 and an anode as top electrode 160 (inverted stack).

Preferably substrate 110 and/or 170 is formed of a transparent material. As referred to herein, a transparent material is a material which, at the thickness generally used in photodiode 100, transmits at least about 60% (preferably at least 70%, more preferably at least 75%, very preferably at least 80%, most preferably at least 95%) of incident light at a wavelength or a range of wavelengths used during operation of the photodiode.

Substrate 170 can be identical to or different from substrate 110.

In a preferred embodiment, only one of substrates 110 and 170 is transparent. In another preferred embodiment, both of substrates 110 and 170 are transparent.

Electrodes 120 and 160 are generally formed of an electrically conductive material. Suitable and preferred electrically conductive materials include electrically conductive metals, electrically conductive alloys, electrically conductive polymers, electrically conductive metal oxides, and any combination of one or more of the aforementioned materials.

Exemplary electrically conductive metals include gold, silver, copper, aluminum, nickel, palladium, platinum, and titanium or nanoparticle or nanowire or nanorods of metals which can be used neat or as a blend with an electrically conductive polymer or neutral binder. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum, and alloys of titanium. Exemplary electrically conductive polymers include polythiophenes, e.g., doped poly(3,4-ethylenedioxythiophene) (also known as PEDOT), polyanilines, e.g., doped polyanilines, polypyrroles, e.g., doped polypyrroles. Exemplary electrically conductive metal oxides include indium tin oxide (ITO), fluorinated tin oxide, tin oxide and zinc oxide or nanoparticle or nanowire or nanorods of metal oxides such as zinc oxide which can be used neat or as a blend with an electrically conductive polymer or neutral binder. In some embodiments, combinations of electrically conductive materials are used.

Preferred electrode materials for forming electrode 120 or 160 are metals such as silver, aluminum, gold, molybdenum and transparent electrodes such as indium tin oxide, and printable conductive materials such as poly(3,4-ethylenedioxythiophene)-poly(styrenesulfonate) PEDOT-PSS, or any combination of one or more of the above materials.

Electrode 160 is preferably formed of an electrically conductive material selected from the group of the materials described above for electrode 120.

In a preferred embodiment, electrode 120 and/or 160 includes a mesh electrode. Examples of mesh electrodes are described in US2004/0187911 A1 and US2006/0090791 A1.

In a photodiode with normal stack, like that according to the first or third preferred embodiment the hole collecting electrode 120 with high work function is located at the bottom and the electron collecting electrode 160 with low work function is located at the top.

In a photodiode with inverted stack, like that according to the second or fourth preferred embodiment the hole collecting electrode 120 with high work function is located at the top and electron collecting electrode 160 with low work function is located at the bottom.

In a photodiode with normal stack for example an ITO electrode can be used as hole collecting or high work function electrode 120 and an Al or Ca electrode can be used as electron collecting or low work function electrode 160.

In a photodiode with inverted stack for example an ITO electrode can be used as electron collecting or low work function electrode 160 and an Ag or Au electrode can be used as hole collecting or high work function electrode 120.

In a preferred embodiment of the present invention, the photodiode comprises, addition to the first HSL 130, one or more additional buffer layers (like layer 150 or 180) acting as HSL, HTL and/or EBL, and/or one or more additional buffer layers acting as ESL, ETL and/or HBL, wherein these additional layers are located between the photoactive layer 140 and the first electrode 120 or the second electrode 160.

Suitable and preferred materials for use in the additional HSLs, HTLs or EBLs include, without limitation, metal oxides, like for example, ZTO, $MoO_x$, $WO_x$, $NiO_x$, or their nano particles, conjugated polymer electrolytes like for example PEDOT:PSS, polymer acids such as polyacryl acid, conjugated polymers, like for example polytriarylamine (PTAA), insulating polymers, like for example nafion, polyethyleneimine or polystyrenesulphonate, and organic compounds, like for example N,N'-diphenyl-N,N'-bis(1-naphthyl)(1,1'-biphenyl)-4,4' diamine (NPB), N,N'-diphenyl-N,N'-(3-methylphenyl)-1,1'-biphenyl-4,4'-diamine (TPD), or a combination of one or more of the above materials.

Suitable and preferred materials for use in the additional ESLs, HBLs or ETLs include, without limitation, metal oxides, like for example, ZnOx, aluminium-doped ZnO (AZO), TiOx, or their nano particles, salts, like for example LiF, NaF, CsF, $CsCO_3$, amines (e.g., primary, secondary, or tertiary amines), conjugated polymer electrolytes, such as polyethylenimine, conjugated polymers, like for example poly[3-(6-trimethylammoniumhexyl) thiophene], poly(9,9-bis(2-ethylhexyl)-fluorene]-b-poly[3-(6-trimethylammoniumhexyl)thiophene], or poly [(9,9-bis(3'-(N,N-dimethylamino) propyl)-2,7-fluorene)-alt-2,7-(9,9-dioctylfluorene)], and organic compounds, like for example tris(8-quinolinolato)-aluminium(III) ($Alq_3$), 4,7-diphenyl-1,10-phenanthroline, or a combination of one or more of the above materials.

Preferably the electron acceptor material (or p-type semiconductor) and the electron donor material (or n-type semiconductor) in the photoactive layer 140 form a self-assembled interconnected network, in particular a bulk heterojunction (BHJ).

Alternatively, photoactive layer 140 may comprise the electron acceptor material and the electron donor material in respective separate layers, i.e. the photoactive layer 140 consists of at least two adjacent layers, one of which essentially consists of an electron acceptor material (p-type semiconductor) and the other essentially consists of an electron donor material (or n-type semiconductor).

A photodiode according to a sixth preferred embodiment of the present invention (inverted structure) comprises the following layers (in the sequence from bottom to top):

optionally a first substrate 110, a low work function electrode 120, preferably comprising a metal or metal oxide, like for example ITO, serving as electron collecting electrode or cathode, an ESL 130, which is for example an ETL or HBL, preferably comprising a metal oxide like TiOx or ZnOx, or a poly(ethyleneimine), a photoactive layer 140 comprising a p-type and an n-type OSC compound, situated between the electrodes, which can exist for example as a p-type/n-type bilayer or as distinct p-type and n-type layers, or as blend of p-type and n-type semiconductor, forming a BHJ, a first HSL 150, which is for example an HTL or EBL, a high work function electrode 160, preferably comprising a metal like for example silver or gold, serving as hole collecting electrode or anode, optionally a second substrate (170), wherein at least one of the electrodes, preferably the cathode 120, is transparent to visible light, and wherein the HSL 150 comprises a conductive polymer and a polymer of formula I as described above and below, or a composition as described above and below.

In the photodiode according to the fifth and sixth preferred embodiments, the first HSL 130 may comprise, in addition to the fluoropolymer of formula I, a conductive polymer as described above and below. Alternatively, the first HSL 130 does not contain, in addition to the polymer of formula I, a conductive polymer, and the photodiode contains a second HSL (180) that is located between the first HSL and the hole collecting electrode and contains a conductive polymer, preferably PEDOT:PSS.

The photodiode according to the present invention can also comprise a device layer (e.g. layer 120, 130, 140, 150 or 160) which is a patterned layer. For applications in modern microelectronics it is generally desirable to generate small structures or patterns to reduce cost (more devices/unit area), and power consumption. Patterning of thin layers comprising a compound according to the present invention can be carried out for example by photolithography, electron beam lithography or laser patterning.

The photoactive layer 140 of the photodiode preferably comprises, or is formed from, a blend containing the n-type OSC and the p-type OSC compound as described above and below, or is formed from a formulation containing the n-type OSC and the p-type OSC compound as described above and below and further containing a solvent, preferably an organic solvent. The formulation is preferably a solution of the n-type OSC and the p-type OSC compound in the solvent.

The n-type and the p-type OSC compound in the photoactive layer preferably form a bulk heterojunction (BHJ).

In a preferred embodiment the n-type OSC compound in the photoactive layer is a monomeric or oligomeric compound.

Suitable and preferred n-type OSCs are for example selected from fullerenes or substituted fullerenes, like for example an indene-C60-fullerene bisadduct like ICBA, or a (6,6)-phenyl-butyric acid methyl ester derivatized methano C60 fullerene, also known as "PCBM-$C_{60}$" or "$C_{60}$PCBM", as disclosed for example in G. Yu, J. Gao, J. C. Hummelen, F. Wudl, A. J. Heeger, Science 1995, Vol. 270, p. 1789 ff, or structural analogous compounds with e.g. a $C_{61}$ fullerene group, a $C_{70}$ fullerene group, or a $C_{71}$ fullerene group (see for example Coakley, K. M. and McGehee, M. D. Chem. Mater. 2004, 16, 4533). More preferred fullerenes are PCBM-C60, PCBM-C70, bis-PCBM-C60, bis-PCBM-C70, ICMA-c60 (1',4'-dihydro-naphtho[2',3':1,2][5,6]fullerene-C60), ICBA, oQDM-C60 (1',4'-dihydro-naphtho[2',3':1,9][5,6]fullerene-C60-lh), or bis-oQDM-C60.

Further preferred n-type OSCs are selected from the group of small molecules that are not a fullerene or fullerene derivative, hereinafter also referred to as "non-fullerene acceptors" or NFAs.

Preferred NFAs are selected from the group of compounds containing a polycyclic electron donating core and attached thereto two terminal electron withdrawing groups. Examples for suitable and preferred NFAs are the compound ITIC and IEIC, as disclosed by Y. Lin et al., *Adv. Mater.* 2015, 27, 1170-1174, or H. Lin et al., *Adv. Mater.*, 2015, 27, 7299.

Further preferred NFAs are selected from naphthalene or perylene derivatives. Suitable and preferred naphthalene or perylene derivatives for use as n-type compounds are described for example in Adv. Sci. 2016, 3, 1600117, *Adv. Mater.* 2016, 28, 8546-8551, *J. Am. Chem. Soc.*, 2016, 138, 7248-7251 and *J. Mater. Chem. A,* 2016, 4, 17604.

The invention further relates to a process of manufacturing a photodiode as described above and below comprising the following steps:

a) depositing a high work function electrode material, preferably a metal or metal oxide, onto a substrate (110), preferably by a sputtering or vapour deposition process, to form a hole collecting electrode (120), b) optionally depositing a conductive polymer onto the hole collecting electrode (120), preferably by a liquid-based coating or printing process, to form a second HSL (180), c) depositing a polymer of formula I or a composition or polymer blend according to the present invention as described above and below, preferably by a liquid-based coating or printing process, onto the hole collecting electrode (120) or, if present, onto the second HSL (180), to form a first HSL (130), d) depositing an electron donor material and an electron acceptor material, very preferably a blend of a p-type and an n-type OSC, preferably by a liquid-based coating or printing process, onto the first HSL (130) to form a photoactive layer (140), e) optionally subjecting the photoactive layer (140) to thermal treatment, such as annealing, to form a randomly organized bulk heterojunction (BHJ), f) optionally depositing an electron selective material onto the photoactive layer (140) to form an ESL (150), for example by a sputtering, vapour deposition or liquid-based process depending on the material used, g) depositing a low work function electrode material onto the photoactive layer (140) or, if present, onto the ESL (150), preferably by a sputtering or vapour deposition process, to form an electron collecting electrode (160), h) optionally applying a second substrate (170) onto the low work function electrode (160).

The process steps a) to h) may also be carried out in reverse order for example when manufacturing a photodiode with inverted structure.

In addition or alternatively to the second substrate, a transparent protective layer or encapsulation layer may be provided onto the photodiode subsequent to steps a) to h).

In another preferred embodiment, the photodiode is formed from two photodiodes which share a common electrode, similar to a tandem photovoltaic cell, as described for example in US2009/0211633 A1, US2007/0181179 A1, US2007/0246094 A1 and US 2007/0272296 A1.

The deposition process for each individual device layer may, depending on the material, be for example a sputtering, vapour deposition or liquid-based process. In case of inorganic materials sputtering, vapour deposition are usually preferred. In case of organic materials a liquid-based process like coating or printing is usually preferred.

In some embodiments, when a device layer (e.g., layer 120, 130, 140, 150 or 160) includes inorganic semiconductor material, a liquid-based coating process can be carried out by (i') mixing the inorganic semiconductor material with a solvent (e.g., an aqueous solvent or an anhydrous alcohol) to form a dispersion, (ii') coating the dispersion onto a substrate, and (iii') drying the coated dispersion.

In general, a liquid-based coating process used to prepare a layer (e.g., layer 120, 130, 140, 150 or 160) containing an OSC can be the same as or different from that used to prepare a layer containing an inorganic semiconductor. In some embodiments, to prepare a layer including an OSC, the liquid-based coating process can be carried out by mixing the OSC with a solvent (e.g., an organic solvent) to form a solution or a dispersion, coating the solution or dispersion on a substrate, and drying the coated solution or dispersion.

Preferably a device layer in the photodiode according to the present invention, in particular the photoactive layer, HSL, ESL, HTL, EBL, HBL and/or ETL (e.g., layer 130, 140 or 150) is prepared from a composition, which is for example a solution or dispersion comprising the active ingredients, like the polymer of formula I and/or the conductive polymer in case of the HSL, or an n-type and/or p-type OSC compound in case of the photoactive layer, optionally further additives, and the solvents, by a process which comprises:
 (i) first mixing the active ingredients, and optionally the additives, and the solvent(s) as described above and below,
 (ii) applying such mixture to a substrate,
 (iii) optionally evaporating the solvent(s) to form a device layer.

In another preferred embodiment, the blend or solution containing the n- type and p-type OSC additionally comprises one or more components or additives selected from the group consisting of surface-active compounds, lubricating agents, wetting agents, dispersing agents, hydrophobing agents, adhesion promoters, flow improvers, defoaming agents, deaerating agents, viscosity modifying agents, conductivity increasing agents, diluents which may be reactive or non-reactive, fillers, processing assistants, auxiliaries, colourants, dyes, pigments, sensitizers, stabilizers, nanoparticles or inhibitors.

In further preferred embodiments one or more additives can be added to one or more device layers in the photodiode according to the present invention, in particular the photoactive layer, HSL, ESL, HTL, EBL, HBL and/or ETL (e.g., layer 130, 140 or 150), to enhance the properties of the device layer or the device, to facilitate the deposition, processing or formation of a layer and/or the deposition, processing or formation of any neighboring layer. Preferably, one or more additives are used which enhance the electrical conductivity and/or charge selectivity of the respective layer and/or passivate the surface of any neighboring layer.

Suitable methods to incorporate one or more additives include, for example exposure to a vapor of the additive at atmospheric pressure or at reduced pressure, mixing a solution or solid containing one or more additives and a material or a formulation as described or preferably described before, bringing one or more additives into contact with a material or a formulation as described before, by thermal diffusion of one or more additives into a material or a formulation as described before, or by ion-implantation of one or more additives into a material or a formulation as described before.

Additives used for this purpose can be organic, inorganic, metallic or hybrid materials. Additives can be molecular compounds, for example organic molecules, salts, ionic liquids, coordination complexes or organometallic compounds, polymers or mixtures thereof. Additives can also be particles, for example hybrid or inorganic particles, preferably nanoparticles, or carbon based materials such as fullerenes, carbon nanotubes or graphene flakes.

Examples for additives that can enhance the electrical conductivity and/or enhance charge selectivity are for example halogens (e.g. $I_2$, $Cl_2$, $Br_2$, ICl, $ICl_3$, IBr and IF), Lewis acids (e.g. $PF_5$, $AsF_5$, $SbF_5$, $BF_3$, $BCl_3$, $SbCl_5$, $BBr_3$ and $SO_3$), protonic acids, organic acids, or amino acids (e.g. HF, HCl, $HNO_3$, $H_2SO_4$, $HClO_4$, $FSO_3H$ and $ClSO_3H$), transition metal compounds (e.g. $FeCl_3$, FeOCl, $Fe(ClO_4)_3$, $Fe(4\text{-}CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid)), anions (e.g. $Cl^-$, $Br^-$, $I^-$, $I^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$), cations (e.g. $H^+$, $Li^+$, $Na^+$, $K^+$, $Rb^+$, $Cs^+$, $Co^{3+}$ and $Fe^{3+}$), $O_2$, redox active salts (e.g. $XeOF_4$, $(NO_2^+)(SbF_6^-)$, $(NO_2^+)(SbCl_6^-)$, $(NO_2^+)(BF_4^-)$, $NOBF_4$, $NOPF_6$, $AgClO_4$, $H_2IrCl_6$ and $La(NO_3)\cdot 6H_2O$), strongly electron-accepting organic molecules (e.g. 2,3,5,6-tetrafluoro-7,7,8,8-tetracyanoquinodimethane (F4-TCNQ)), transition metal oxides (e.g. $WO_3$, $Re_2O_7$ and $MoO_3$), metal-organic complexes of cobalt, iron, bismuth and molybdenum, (p-$BrC_6H_4)_3NSbCl_6$, bismuth(III) tris(trifluoroacetate), $FSO_2OOSO_2F$, acetylcholine, $R_4N^+$, (R is an alkyl group), $R_4P^+$ (R is a straight-chain or branched alkyl group 1 to 20), $R_6As^+$ (R is an alkyl group), $R_3S^+$ (R is an alkyl group) and ionic liquids (e.g. 1-Ethyl-3-methylimidazolium bis(trifluoromethylsulfonyl)imide). Suitable cobalt complexes beside of tris(2-(1H-pyrazol-1-yl)-4-tert-butylpyridine)-cobalt(III) tris(bis(trifluoromethylsulfonyl)imide)) are cobalt complex salts as described in WO 2012/114315, WO 2012/114316, WO 2014/082706, WO 2014/082704, EP 2883881 or JP 2013-131477. Many of these aforementioned additives can also be used as oxidizing agent or catalyst in the oxidative polymerization process of preparing a composition comprising a conductive polymer as described above and below, depending on the work function of the monomer.

Each of the individual layers in a device according to the present invention is typically applied as thin layer or film. The thickness of such a thin layer or film may be preferably less than 30 microns, very preferably less than 1 micron.

The individual layers in a device according to the present invention may be deposited by any suitable method. Liquid coating of devices is more desirable than vacuum deposition techniques. Solution deposition methods are especially preferred.

The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. For the fabrication of devices and modules area printing methods compatible with flexible substrates are preferred, for example slot dye coating, spray coating and the like.

Ink jet printing is particularly preferred when high resolution layers and devices needs to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the OSC compounds or polymers should be first dissolved in a suitable solvent.

Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-C1-2-alkylanilines and other fluorinated or chlorinated aromatics.

A preferred solvent for depositing the OSC compounds or polymers by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the compound or polymer, which reduces or prevents clogging of the jets and separation of the components during spraying. The solvent(s) may include those selected from the group of the following list of examples: dodecylbenzene, 1-methyl-4-tert-butylbenzene, terpineol, limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

In a preferred embodimentof the present invention, after depositing the photoactive layer on the substrate the n-type and p-type OSC compound form a BHJ that phase separates at nanoscale level. For discussion on nanoscale phase separation see Dennler et al., Proceedings of the *IEEE*, 2005, 93 (8), 1429 or Hoppe et al., *Adv. Func. Mater*, 2004, 14(10), 1005.An optional annealing step may be then necessary to optimize blend morpohology and consequently device performance.

Another method to optimize device performance is to prepare formulations, especially for the fabrication of BHJ OPV devices that may include high boiling point additives to promote phase separation in the right way. 1,8-Octanedithiol, 1,8-diiodooctane, nitrobenzene, chloronaphthalene, and other additives have been used to obtain high-efficiency solar cells. Examples are disclosed in J. Peet, et al., *Nat. Mater.*, 2007, 6, 497 or Fréchet et al., *J. Am. Chem. Soc.*, 2010, 132, 7595-7597.

An OPD device as described above and below can be used in a sensor device, for example a biosensor, or a detector or detector array for vein pattern recognition.

Unless the context clearly indicates otherwise, as used herein plural forms of the terms herein are to be construed as including the singular form and vice versa. Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius.

The invention will now be described in more detail by reference to the following examples, which are illustrative only and do not limit the scope of the invention.

A: Synthesis and Composition Examples

Comparative Example 1

Comparative Example 1 illustrates a synthesis of a comparative material Poly-3,4-Ethylenedioxythiophene:Nafion® (1:15) in a watery dispersion.

0.10 g of 3,4-Ethylenedioxythiophene (Sigma-Aldrich Chemie GmbH/Article Nr.: 483028) and 6.0 g Nafion® perfluorinated resin, aqueous dispersion (Sigma-Aldrich Chemie GmbH/Article Nr.: 527114) are added together with 50 mL of distilled water and 0.21 g Sodiumpersulfate (Sigma-Aldrich Chemie GmbH/Article Nr.: 71889) into a 100 $cm^3$ glass-flask. Immediately afterwards the reaction solution is stirred with an Ultra-Turrax (T 18 digital ULTRA-TURRAX®/IKA®-Werke GmbH & Co. KG) and 0.26 $cm^3$ of a fresh Fe-stock solution (0.24 g Iron(III) sulfate hydrate (Alfa Aesar/Article Nr.: 33316) and 60 g distilled water) is added. The reaction solution is stirred for at least 2 hours reaction time at 23° C. The resulting deep blue dispersion is then stirred together with 0.95 g Lewatit® MP-62 free base (Sigma-Aldrich Chemie GmbH/Article Nr.: 62088) and 0.95 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

Figure 4:
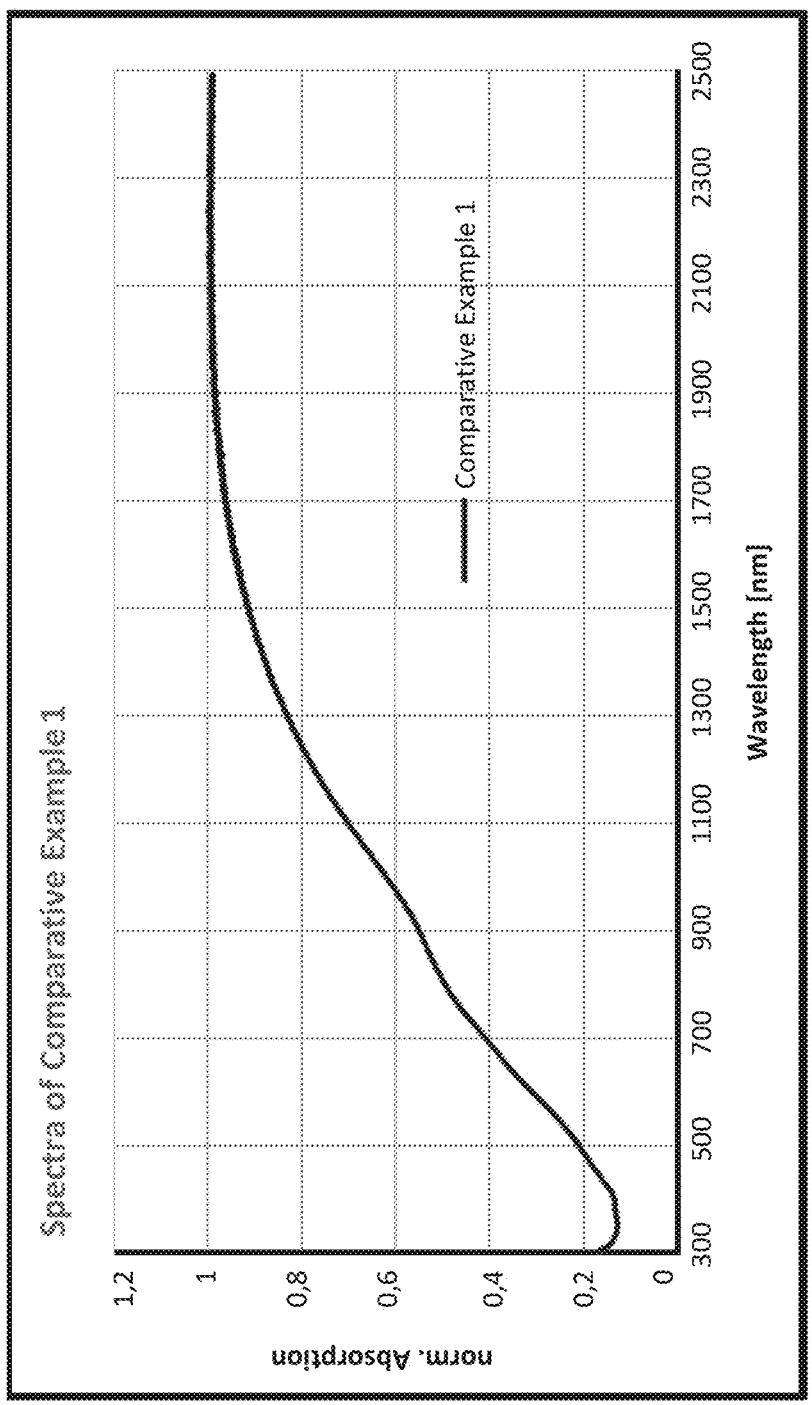
FIG. 4-9 show the normalized absorption spectra of dispersions according to Examples 1-10.

A few drops of the final dispersion are applied on a glass cuvette. The dried film shows conductivity (Metrahit one Analog-Digital-Multimeter/GMC-I Gossen-Metrawatt GmbH) and is analyzed with a spectrometer. The normalized spectrum is shown in FIG. 4.

Example 1

Example 1 illustrates the synthesis of Poly-3,4-Ethylenedioxythiophene:Aquivion® in a watery dispersion.

0.10 g of 3,4-Ethylenedioxythiophene (Sigma-Aldrich Chemie GmbH/Article Nr.: 483028) and 4.0 g Aquivion® D72-25BS (Sigma-Aldrich Chemie GmbH/Article Nr.: 802549) are added together with 50 mL of distilled water and 0.21 g Sodiumpersulfate (Sigma-Aldrich Chemie GmbH/Article Nr.: 71889) into a 100 $cm^3$ glass-flask. Immediately afterwards the reaction solution is stirred with an Ultra-Turrax (T 18 digital ULTRA-TURRAX®/IKA®-Werke GmbH & Co. KG) and 0.26 cm$^3$ of a fresh Fe-stock solution (0.24 g Iron(III) sulfate hydrate (Alfa Aesar/33316) and 60 g distilled water) is added. The reaction solution is stirred for at least 2 hours reaction time at 23° C. The resulting deep blue dispersion is then stirred together with 0.95 g Lewatit® MP-62 free base (Sigma-Aldrich Chemie GmbH/Article Nr.: 62088) and 0.95 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Example 2

Example 2 illustrates the synthesis of Poly-3,4-Ethylenedioxythiophene:Aquivion® in a watery dispersion.

0.10 g of 3,4-Ethylenedioxythiophene (Sigma-Aldrich Chemie GmbH/Article Nr.: 483028) and 6.0 g Aquivion® D72-25BS (Sigma-Aldrich Chemie GmbH/Article Nr.: 802549) are added together with 50 mL of distilled water and 0.21 g Sodiumpersulfate (Sigma-Aldrich Chemie GmbH/Article Nr.: 71889) into a 100 cm$^3$ glass-flask. Immediately afterwards the reaction solution is stirred with an Ultra-Turrax (T 18 digital ULTRA-TURRAX®/IKA®-Werke GmbH & Co. KG) and 0.26 cm$^3$ of a fresh Fe-stock solution (0.24 g Iron(III) sulfate hydrate (Alfa Aesar/33316) and 60 g distilled water) is added. The reaction solution is stirred for at least 2 hours reaction time at 23° C. The resulting deep blue dispersion is then stirred together with 0.95 g Lewatit® MP-62 free base (Sigma-Aldrich Chemie GmbH/Article Nr.: 62088) and 0.95 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Example 3

Example 3 illustrates the synthesis of Poly-3,4-Ethylenedioxythiophene:Aquivion® in a watery dispersion.

0.10 g of 3,4-Ethylenedioxythiophene (Sigma-Aldrich Chemie GmbH/Article Nr.: 483028) and 8.0 g Aquivion® D72-25BS (Sigma-Aldrich Chemie GmbH/Article Nr.: 802549) are added together with 50 mL of distilled water and 0.21 g Sodiumpersulfate (Sigma-Aldrich Chemie GmbH/Article Nr.: 71889) into a 100 cm$^3$ glass-flask. Immediately afterwards the reaction solution is stirred with an Ultra-Turrax (T 18 digital ULTRA-TURRAX®/IKA®-Werke GmbH & Co. KG) and 0.26 cm$^3$ of a fresh Fe— stock solution (0.24 g Iron(III) sulfate hydrate (Alfa Aesar/Article Nr.: 33316) and 60 g distilled water) is added. The reaction solution is stirred for at least 2 hours reaction time at 23° C. The resulting deep blue dispersion is then stirred together with 0.95 g Lewatit® MP-62 free base (Sigma-Aldrich Chemie GmbH/Article Nr.: 62088) and 0.95 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Figure 5:
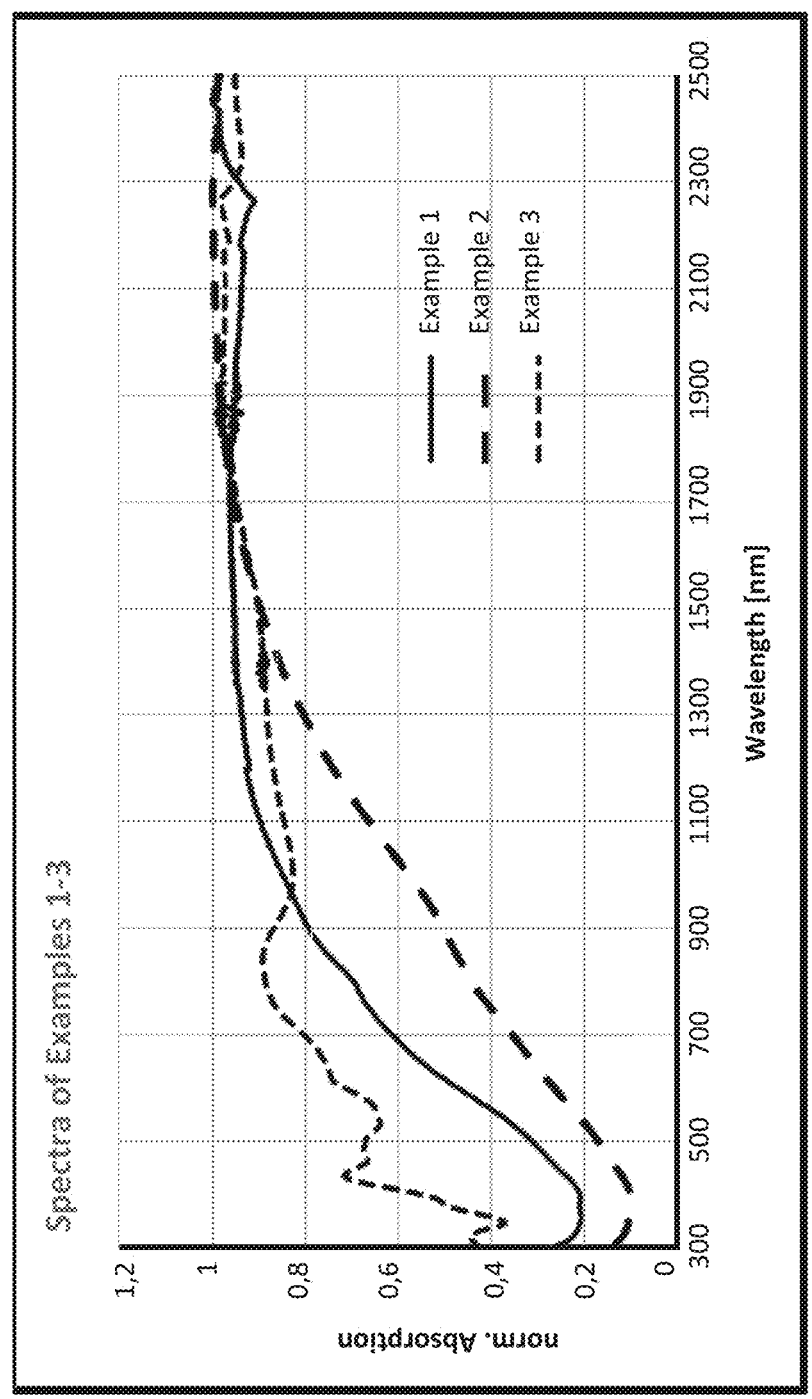

The normalized spectrum of Examples 1-3 is shown in FIG. 5.

Example 4

Example 4 illustrates the synthesis of Poly-3,4-ethylenedioxythiophene:Aquivion® with perfluorinated sulfonic acid in a watery dispersion. 0.10 g of 3,4-Ethylenedioxythiophene (Sigma-Aldrich Chemie GmbH/Article Nr.: 483028) and 6.0 g Aquivion® D72-25BS (Sigma-Aldrich Chemie GmbH/Article Nr.: 802549) are added together with 50 mL of distilled water, 0.21 g Sodiumpersulfate (Sigma-Aldrich Chemie GmbH/Article Nr.: 71889) and 0.05 g Trifluoromethanesulfonic acid (Sigma-Aldrich Chemie GmbH/Article Nr.: 158534) into a 100 cm$^3$ glass-flask. Immediately afterwards the reaction solution is stirred with an Ultra-Turrax (T 18 digital ULTRA-TURRAX®/IKA®-Werke GmbH & Co. KG) and 0.26 cm$^3$ of a fresh Fe-stock solution (0.24 g Iron(III) sulfate hydrate (Alfa Aesar/Article Nr.: 33316) and 60 g distilled water) is added. The reaction solution is stirred for at least 2 hours reaction time at 23° C. The resulting deep blue dispersion is then stirred together with 0.95 g Lewatit® MP-62 free base (Sigma-Aldrich Chemie GmbH/Article Nr.: 62088) and 0.95 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301). A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Example 5

Example 5 illustrates the synthesis of Poly-3,4-ethylenedioxythiophene:Aquivion® with perfluorinated sulfonic acid in a watery dispersion.

0.10 g of 3,4-Ethylenedioxythiophene (Sigma-Aldrich Chemie GmbH/Article Nr.: 483028) and 6.0 g Aquivion® D72-25BS (Sigma-Aldrich Chemie GmbH/Article Nr.: 802549) are added together with 50 mL of distilled water, 0.21 g Sodiumpersulfate (Sigma-Aldrich Chemie GmbH/Article Nr.: 71889) and 0.11 g Nonafluorobutane-1-sulfonic acid (Sigma-Aldrich Chemie GmbH/Article Nr.: 562629) into a 100 cm$^3$ glass-flask. Immediately afterwards the reaction solution is stirred with an Ultra-Turrax (T 18 digital ULTRA-TURRAX®/IKA®-Werke GmbH & Co. KG) and 0.26 cm$^3$ of a fresh Fe-stock solution (0.24 g Iron(III) sulfate hydrate (Alfa Aesar/Article Nr.: 33316) and 60 g distilled water) is added. The reaction solution is stirred for at least 2 hours reaction time at 23° C. The resulting deep blue dispersion is then stirred together with 0.95 g Lewatit® MP-62 free base (Sigma-Aldrich Chemie GmbH/Article Nr.: 62088) and 0.95 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Example 6

Example 6 illustrates the synthesis of Poly-3,4-ethylene-dioxythiophene:Aquivion® with a perfluorinated sulfonic acid in a watery dispersion.

0.10 g of 3,4-Ethylenedioxythiophene (Sigma-Aldrich Chemie GmbH/Article Nr.: 483028) and 6.0 g Aquivion® D72-25BS (Sigma-Aldrich Chemie GmbH/Article Nr.: 802549) are added together with 50 mL of distilled water, 0.21 g Sodiumpersulfate (Sigma-Aldrich Chemie GmbH/Article Nr.: 71889) and 0.03 g Heptadecafluorooctanesulfonic acid (Sigma-Aldrich Chemie GmbH/Article Nr.: 77283) into a 100 $cm^3$ glass-flask. Immediately afterwards the reaction solution is stirred with an Ultra-Turrax (T 18 digital ULTRA-TURRAX®/IKA®-Werke GmbH & Co. KG) and 0.26 $cm^3$ of a fresh Fe-stock solution (0.24 g Iron(III) sulfate hydrate (Alfa Aesar/Article Nr.: 33316) and 60 g distilled water) is added. The reaction is stirred for at least 2 hours reaction time at 23° C. The resulting deep blue dispersion is then stirred together with 0.95 g Lewatit® MP-62 free base (Sigma-Aldrich Chemie GmbH/Article Nr.: 62088) and 0.95 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Figure 6:
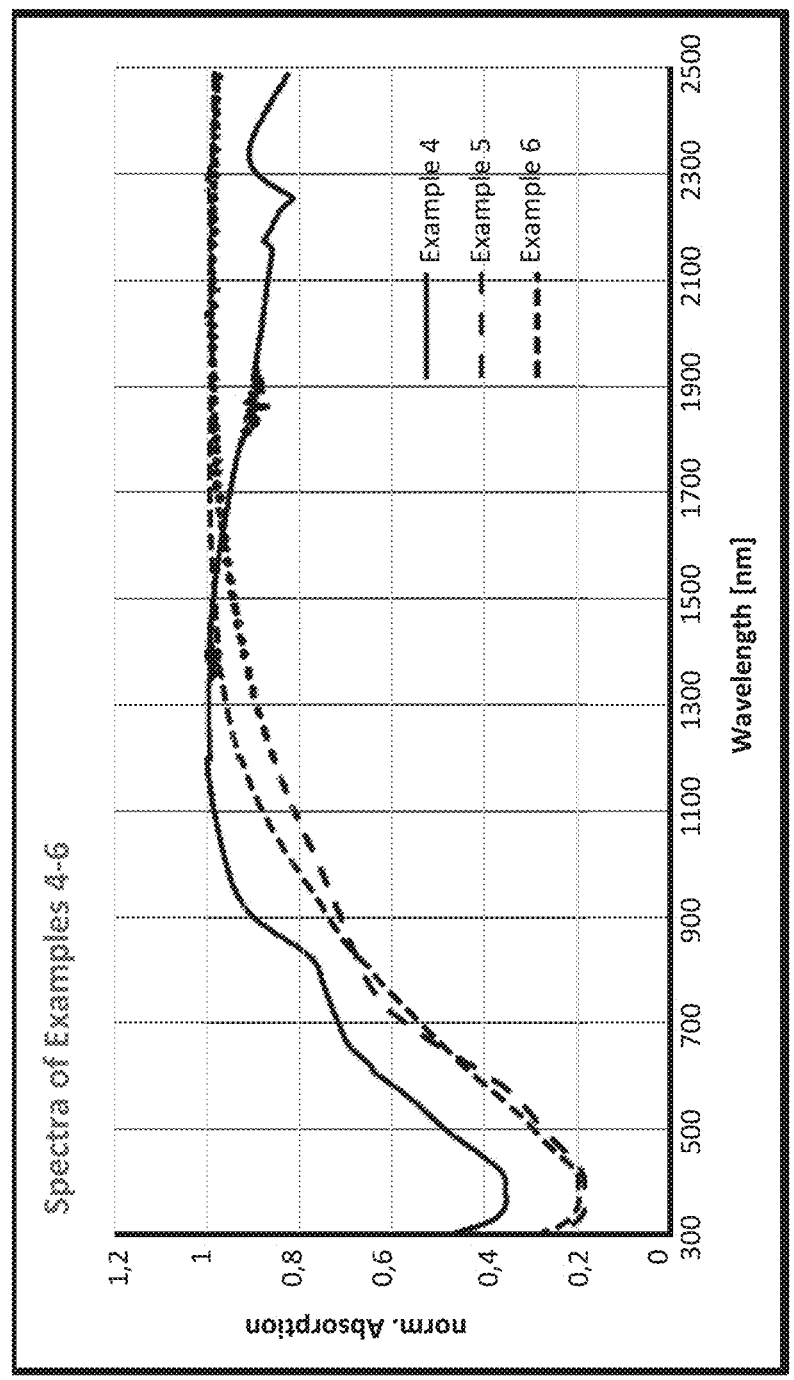

The normalized spectrum of Examples 4-6 is shown in FIG. 6.

Example 7

Example 7 illustrates the synthesis of Poly-3,4-ethylene-dioxythiophene:Aquivion® in a watery dispersion with the usage of a syringe pump.

30.0 g Aquivion® D72-25BS (Sigma-Aldrich Chemie GmbH/Article Nr.: 802549) are added together with 250 mL of distilled water and 1.05 g Sodiumpersulfate (Sigma-Aldrich Chemie GmbH/Article Nr.: 71889) into a 250 $cm^3$ glass-flask. Immediately afterwards the reaction solution is stirred with an Ultra-Turrax (T 18 digital ULTRA-TURRAX®/IKA®-Werke GmbH & Co. KG) and 0.52 $cm^3$ of a fresh Fe-stock solution (0.24 g Iron(III) sulfate hydrate (Alfa Aesar/Article Nr.: 33316) and 60 g distilled water) is added. 0.50 g of 3,4-Ethylenedioxythiophene (Sigma-Aldrich Chemie GmbH/Article Nr.: 483028) is pumped with the help of the syringe pump (KDS Legato 200 series) into the reaction solution within 30 minutes. The reaction solution is stirred for at least 2 hours reaction time afterwards at 23° C. The resulting deep blue dispersion is then stirred together with 4.75 g Lewatit® MP-62 free base (Sigma-Aldrich Chemie GmbH/Article Nr.: 62088) and 4.75 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Example 8

Example 8 illustrates the synthesis of Poly-3,4-ethylene-dioxythiophene:Aquivion® in a watery dispersion with the usage of two syringe pumps.

12.0 g Aquivion® D72-25BS (Sigma-Aldrich Chemie GmbH/Article Nr.: 802549) is added together with 100 mL of distilled water into a 100 $cm^3$ glass-flask. Immediately afterwards the reaction solution is stirred with an Ultra-Turrax (T 18 digital ULTRA-TURRAX®/IKA®-Werke GmbH & Co. KG) and 0.52 $cm^3$ of a fresh Fe-stock solution [0.24 g Iron(III) sulfate hydrate (Alfa Aesar/Article Nr.: 33316) and 60 g distilled water] is added. 0.20 g of 3,4-Ethylenedioxythiophene (Sigma-Aldrich Chemie GmbH/Article Nr.: 483028) and 4 mL of a fresh Oxidizer-stock solution [5.25 g Sodiumpersulfate (Sigma-Aldrich Chemie GmbH/Article Nr.: 71889) filled up to 50 mL in a graduated 50 mL with water] are pumped with the help of the syringe pump (KDS Legato 200 series) into the reaction solution within 20 hours at 23° C. The reaction solution is stirred for at least 30 minutes reaction time afterwards at 23° C.

The resulting deep blue dispersion is then stirred together with 1.90 g Lewatit® MP-62 free base (Sigma-Aldrich Chemie GmbH/Article Nr.: 62088) and 1.90 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Figure 7:
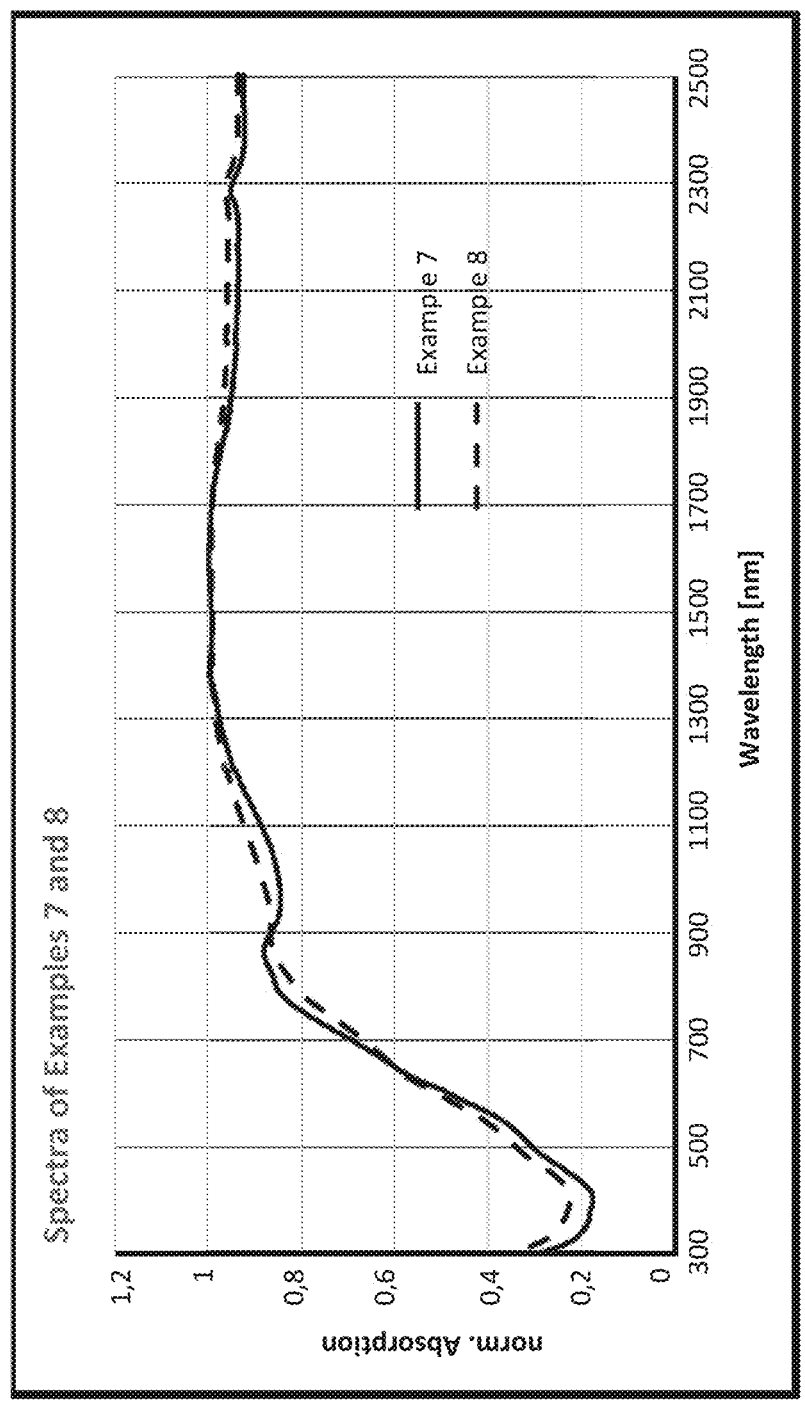

The normalized spectrum of Examples 7 and 8 is shown in FIG. 7.

Example 9

Example 9 illustrates the synthesis of Poly-3,4-ethylene-dioxythiophene:Aquivion® in a watery dispersion with a high solid content.

0.15 g of 3,4-Ethylenedioxythiophene (Sigma-Aldrich Chemie GmbH/Article Nr.: 483028) and 9.0 g Aquivion® D72-25BS (Sigma-Aldrich Chemie GmbH/Article Nr.: 802549) are added together with 41 $cm^3$ of distilled water and 0.32 g Sodiumpersulfate (Sigma-Aldrich Chemie GmbH/Article Nr.: 71889) into a 100 $cm^3$ glass-flask. Immediately afterwards the reaction solution is stirred with an Ultra-Turrax (T 18 digital ULTRA-TURRAX®/IKA®-Werke GmbH & Co. KG) and 0.26 $cm^3$ of a fresh Fe— stock solution (0.24 g Iron(III) sulfate hydrate (Alfa Aesar/33316) and 60 g distilled water) is added. The reaction solution is stirred for at least 2 hours reaction time at 23° C. The resulting deep blue dispersion is then stirred together with 0.95 g Lewatit® MP-62 free base (Sigma-Aldrich Chemie GmbH/Article Nr.: 62088) and 0.95 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Figure 8:
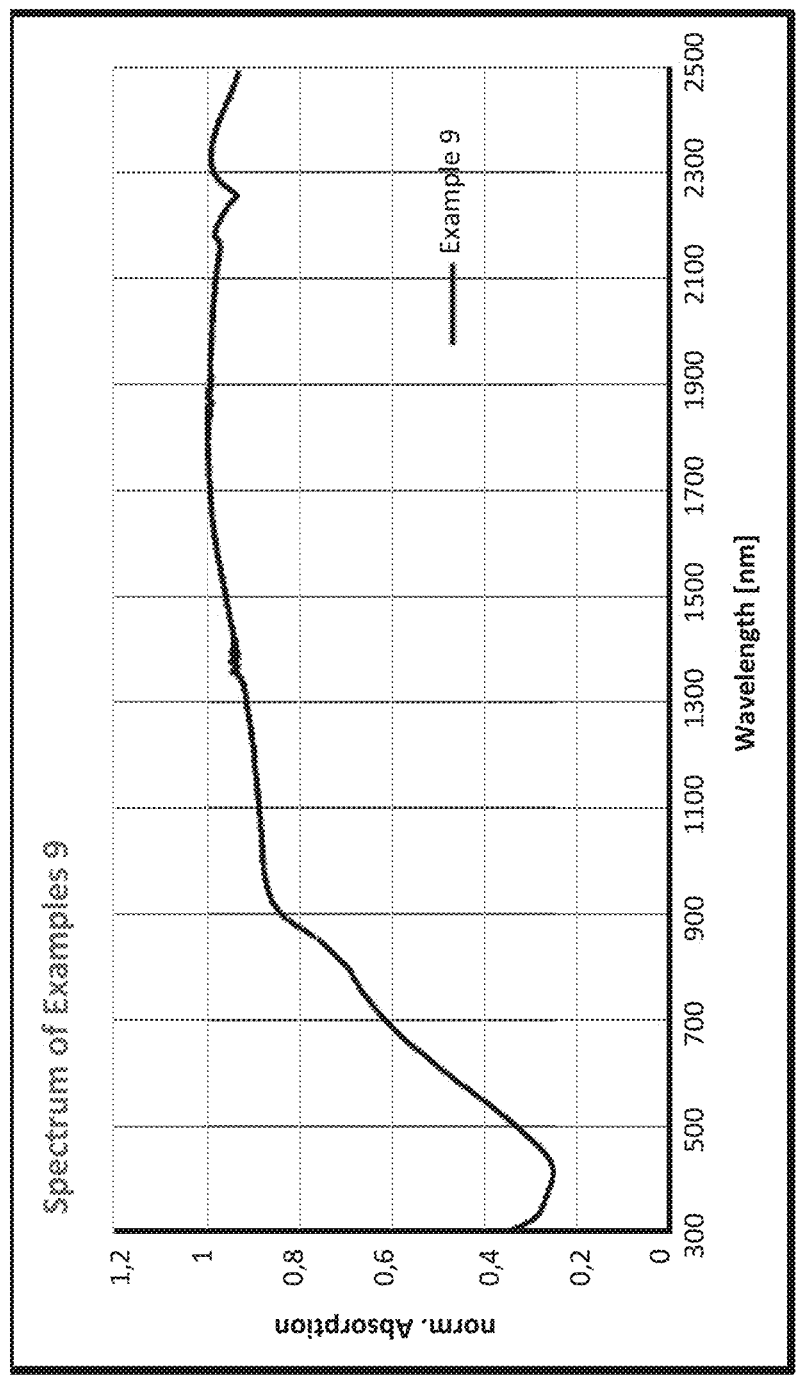

The normalized spectrum of Example 9 is shown in FIG. 8.

Example 10

Example 10 illustrates the synthesis of Poly-3,4-ethylenedithiothiophene:Aquivion® in a watery dispersion.

0.12 g of 3,4-Ethylenedithiothiophene (Sigma-Aldrich Chemie GmbH/Article Nr.: 729078) and 6.0 g Aquivion® D72-25BS (Sigma-Aldrich Chemie GmbH/Article Nr.: 802549) are added together with 50 cm$^3$ of distilled water and 0.21 g Sodiumpersulfate (Sigma-Aldrich Chemie GmbH/Article Nr.: 71889) into a 100 cm$^3$ glass-flask. Immediately afterwards the reaction solution is stirred with an Ultra-Turrax (T 18 digital ULTRA-TURRAX®/IKA®-Werke GmbH & Co. KG) and 0.26 cm$^3$ of a fresh Fe-stock solution (0.24 g Iron(III) sulfate hydrate (Alfa Aesar/33316) and 60 g distilled water) is added. The reaction solution is stirred for at least 2 hours reaction time at 23° C. The resulting deep blue dispersion is then stirred together with 0.95 g Lewatit® MP-62 free base (Sigma-Aldrich Chemie GmbH/Article Nr.: 62088) and 0.95 g Amberlite® IR-120 hydrogen form (Sigma-Aldrich GmbH/Article Nr.: 06428) via magnetic stirrer at 800 rpm over 3 hours. The dispersion is filtrated afterwards through Whatman™ 597 filter (VWR International GmbH/Article Nr.: 515-4301).

A few drops of the final dispersion are applied on a glass cuvette. The dried film shows conductivity (Metrahit one Analog-Digital-Multimeter/GMC-I Gossen-Metrawatt GmbH) and is analyzed with a spectrometer.

Figure 9:
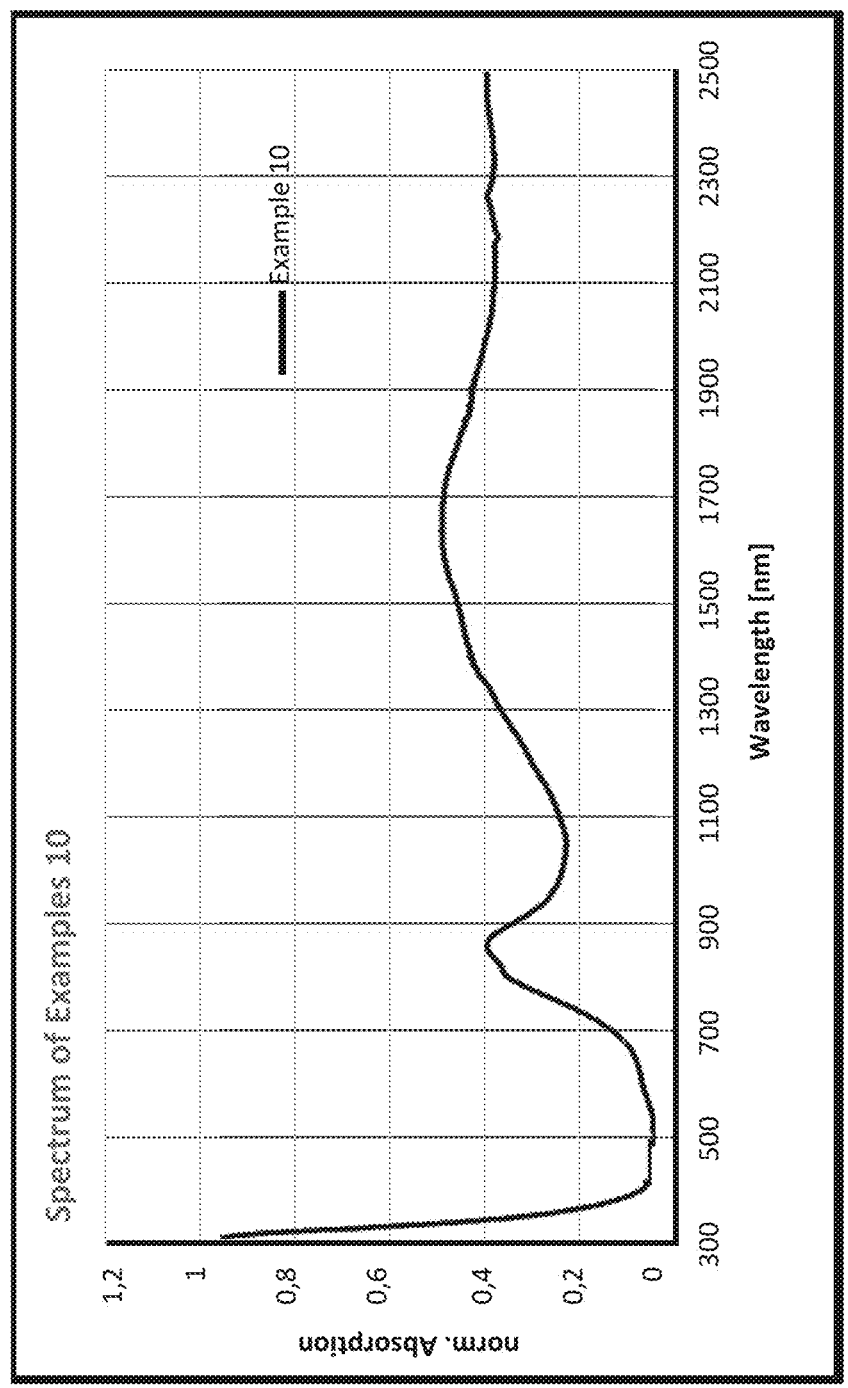

The normalized spectrum of Example 10 is shown in FIG. 9.

Examples 11-16

Examples 11-16 illustrate the synthesis of Poly-3,4-ethylenedioxythiophene:Aquivion® in a watery dispersion with the usage of a syringe pump and the addition of different surfactants after the synthesis.

30.0 g Aquivion® D72-25BS (Sigma-Aldrich Chemie GmbH/Article Nr.: 802549) are added together with 250 mL of distilled water and 1.05 g Sodiumpersulfate (Sigma-Aldrich Chemie GmbH/Article Nr.: 71889) into a 250 cm$^3$ glass-flask. Immediately afterwards the reaction solution is stirred with an Ultra-Turrax (T 18 digital ULTRA-TURRAX®/IKA®-Werke GmbH & Co. KG) and 0.52 cm$^3$ of a fresh Fe-stock solution (0.24 g Iron(III) sulfate hydrate (Alfa Aesar/Article Nr.: 33316) and 60 g distilled water) is added. 0.50 g of 3,4-Ethylenedioxythiophene (Sigma-Aldrich Chemie GmbH/Article Nr.: 483028) is pumped with the help of the syringe pump (KDS Legato 200 series) into the reaction solution within 30 minutes. The reaction solution is stirred for at least 2 hours reaction time afterwards at 23° C. The resulting deep blue dispersion is then stirred together with 4.75 g Lewatit® MP-62 free base (Sigma-Aldrich Chemie GmbH/Article Nr.: 62088) and 4.75 g Amberlite® IR-120 hydrogen form (Sigma-Aldrich Chemie GmbH/Article Nr.: 06428) via magnetic stirrer at 800 rpm over 3 hours. The dispersion is filtrated afterwards through Whatman™ 597 filter (VWR International GmbH/Article Nr.: 515-4301).

Addition of different surfactants to the synthesized PEDOT:Aquivion720

The former synthesized PEDOT:Aquivion720 is used to prepare the following dispersions. The respective surfactant is weight in a small sealable brown-glass bottle and filled up to 10 g with the PEDOT:Aquivion720. The prepared dispersions are stirred via magnetic stirrer for at least 1 hour.

Example 11: 0.01 g Zonyl FSA (abcr GmbH)

Example 12: 0.01 g Zonyl FS-300 (abcr GmbH)

Example 13: 0.025 g Dynol 604 (Evonik Industries AG)

Example 14: 0.02 g Capstone FS-83 (The Chemours Company)

Example 15: 0.04 g CoatOSil 1220 (Momentive Performance Materials Inc.)

Example 16: 0.03 g CoatOSil 1211 (Momentive Performance Materials Inc.)

Comparative Example 2

A Nafion® perfluorinated resin solution (Sigma-Aldrich GmbH/Article Nr.: 510211) is diluted with a mixture of IPA:H2O 9:1 (by volume), such that the overall ratio of nafion solution to solvent mixture is 1:9 by volume.

Example 17

An Aquivion® D83-06A solution (Sigma-Aldrich GmbH/Article Nr.: 802603) is diluted with a solvent mixture of 3-Methyl-2-Pentanone and 1-butanol, so that the overall material ratios by volume are 8.5:56.5:35%.

B: Device Examples

B1: Work Function Test of PEDOT:PSS and Example 2 as HSL

Work function is measured using a Riken Keiki® AC-2. Example 2 is adopted for HSL material and is coated on the glass to form the film sample. The work function of the film sample and the comparative example PEDOT:PSS are then measured using AC-2. The results are shown in Table 1

TABLE 1

| Work Function of HSLs using different materials | |
|---|---|
| Materials | Work function (eV) |
| PEDOT: PSS | 5.00 |
| Example 2 | 5.68 |

From Table 1 it can be seen that Example 2 of the present invention shows better work function (5.68 eV) compared to PEDOT:PSS as the comparative example (5.00 eV), and is therefore proved the compound design of the present invention.

B2: Device Testing

Current-voltage characteristics are measured using a Keithley 2400 SMU while the solar cells are illuminated by a Newport Solar Simulator at 100 mW·cm-2 white light. The solar simulator is equipped with AM1.5 G filters. The illumination intensity is calibrated using a Si photodiode. All the device preparation and characterization is done under atmospheric conditions.

Power conversion efficiency is calculated using the following expression $$n = \frac{V_{OC} \times J_{SC} \times FF}{P_{in}}$$

where FF is defined as $$FF = \frac{V_{max} \times J_{max}}{V_{0c} \times J_{sc}}$$

Details of the device performance are shown in Table 2 and 3 below.

B3: Inverted Bulk Heteroiunction Organic Photovoltaic Devices Using a Polymer Blend of Examples 1-8 as HSL Organic photovoltaic (OPV) devices are fabricated on pre-patterned ITO-glass substrates (130/sq.) purchased from IVOY Limited, HongKong. Substrates are cleaned using common solvents (acetone, iso-propanol, deionized-water) in an ultrasonic bath. A layer of commercially available mixed PV-E002a and PV-E002b (Merck KGaA) is applied as a uniform coating by doctor blade at 80° C. and then annealed at 100° C. for 10 min in air. A thin film of commercially available PV-F1062 ink (Merck KGaA) is applied as a uniform coating by doctor blade in air atmosphere to achieve active layer thicknesses of ca. 250 nm as measured using a profilometer. A short drying period follows to ensure removal of any residual solvent. Typically, films are dried at 60° C. for 2 minutes on a hotplate.

On top of the active layer 0.14 mL of a conductive polymer of Comparative Example C1 to Example 10, or 0.18 mL of PEDOT:PSS (Heraeus Clevios Al4083), was spread and uniformly coated by doctor blade at 65° C. The polymer solution was first diluted with isopropanol at 1 to 4 times ratio (by volume) before coating on the active layer. The dilution was achieved by adding isopropanol drop-wise while stirring the polymer at 600 rpm at room temperature in air. All coatings were done in air. The substrates were then heated at 120 or 125° C. for 5 minutes in a nitrogen atmosphere. Afterwards Ag (100 nm) anode are thermally evaporated through a shadow mask to define the cells.

Devices with a fill-factor of more than 50% were exposed to continuous light at 100 mW/cm$^2$ intensity with AM1.5G spectrum for 140 hours. The devices were kept at open circuit load condition during the testing.

Table 2 shows the device characteristics for the individual OPV devices comprising a photoactive layer and a HSL made of PEDOT:PSS, Comparative Example 1 and Example 1-8.

TABLE 2

Photovoltaic cell characteristics under simulated solar irradiation at 1 sun (AM1.5G)

| | Average Performance | | | | Ageing | |
|---|---|---|---|---|---|---|
| HSL | Voc mV | Jsc mA·cm$^{-2}$ | FF % | PCE % | Time h | Lost % vs T$_0$ |
| PEDOT:PSS | 788 | 11.4 | 55.7 | 5.0 | 140 | 56% |
| Comp. Example 1 | 825 | 11.7 | 54.7 | 5.3 | 140 | 60% |
| Example 1 | 684 | 13.3 | 51.6 | 4.7 | 140 | 72% |
| Example 2 | 809 | 11.1 | 60.0 | 5.4 | 140 | 70% |
| Example 3 | 799 | 11.7 | 34.5 | 3.2 | — | — |
| Example 4 | 795 | 12.5 | 58.1 | 5.8 | 140 | 67% |

TABLE 2-continued

Photovoltaic cell characteristics under simulated solar irradiation at 1 sun (AM1.5G)

| | Average Performance | | | | Ageing | |
|---|---|---|---|---|---|---|
| HSL | Voc mV | Jsc mA·cm$^{-2}$ | FF % | PCE % | Time h | Lost % vs T$_0$ |
| Example 5 | 809 | 11.9 | 59.7 | 5.7 | 140 | 66% |
| Example 6 | 820 | 10.4 | 54.3 | 4.6 | 140 | 54% |
| Example 7 | 806 | 11.1 | 50.7 | 4.5 | — | — |
| Example 8 | 828 | 10.7 | 55.1 | 4.9 | — | — |
| Example 9 | 818 | 11.0 | 61.2 | 5.5 | — | — |
| Example 10 | 798 | 9.4 | 43.8 | 3.29 | — | — |

From Table 2 it can be seen that most OPV devices with a HSL prepared from Example 1-10 to the invention, show equivalent or higher PCE to OPV device made of PEDOT:PSS with equal or higher performance after ageing. Furthermore, devices including Examples 1-2 and 4-9 show equal or significantly higher performance (Example 4-5) compared to the device with a HSL prepared from Comparative Example 1. Finally, devices including Examples 1-2 and 4-6 show equal or significantly higher long term stability compared to the device made with Comparative Example 1.

B3: Inverted Bulk Heterojunction Organic Photovoltaic Devices Using Aquivion® as Interlayer Organic photovoltaic (OPV) devices are fabricated on pre-patterned ITO-glass substrates (130 Ω/sq.) purchased from IVOY Limited, HongKong. Substrates are cleaned using common solvents (acetone, iso-propanol, deionized-water) in an ultrasonic bath. A layer of commercially available mixed PV-E002a and PV-E002b (Merck KGaA) is applied as a uniform coating by doctor blade at 80° C. and then annealed at 100° C. for 10 min in air. A thin film of commercially available PV-F1062 ink (Merck KGaA) is applied as a uniform coating by doctor blade in air atmosphere to achieve active layer thicknesses of ca. 250 nm as measured using a profilometer. A short drying period follows to ensure removal of any residual solvent. Typically, films are dried at 60° C. for 2 minutes on a hotplate.

0.14 mL of solution of Comparative Example 2, or 0.08 mL of solution of Example 17, are applied as a uniform coating by doctor blade at 40° C. in air on top of the active layer to achieve a homogenous thin layer of less than 30 nm. All coatings were done in air. The substrates were then heated at 120° C. for 5 minutes in a nitrogen atmosphere. Afterwards Ag (100 nm) anode are thermally evaporated through a shadow mask to define the cells.

Table 3 shows the device characteristics for the individual OPV devices comprising a photoactive layer and an interlayer.

TABLE 3

Photovoltaic cell characteristics under simulated solar irradiation at 1 sun (AM1.5G)

| | Average Performance | | | |
|---|---|---|---|---|
| Example | Voc mV | Jsc mA·cm$^{-2}$ | FF % | PCE % |
| Comparative Example 2 | 585 | 3.5 | 13.6 | 0.3 |
| Example 17 | 829 | 8.6 | 48.6 | 3.5 |

From Table 3, it can be seen that OPV devices including an HSL prepared from Example 17 according to the invention shows significantly higher performance compared to device with a HSL prepared from Comparative Example 2 (Nafion®).

B4: Inverted Bulk Heterojunction Organic Photovoltaic Devices Using Example 2 as HSL and PV-F1622 as an Active Layer Ink Organic photovoltaic (OPV) devices are fabricated on pre-patterned ITO-glass substrates (13 Ω/sq.) purchased from IVOY Limited, HongKong. Substrates are cleaned using common solvents (acetone, iso-propanol, deionized-water) in an ultrasonic bath. A layer of commercially available mixed PV-E002a and PV-E002b (Merck KGaA) is applied as a uniform coating by doctor blade at 80° C. and then annealed at 100° C. for 10 min in air. A thin film of commercially available PV-F1622 ink which contains a non-fullerene acceptor (Merck KGaA) is applied as a uniform coating by doctor blade in air atmosphere to achieve active layer thicknesses of ca. 250 nm as measured using a profilometer. A short drying period follows to ensure removal of any residual solvent. Typically, films are dried at 60° C. for 2 minutes on a hotplate.

0.14 mL of a conductive polymer of Example 2 was first diluted with isopropanol at 1 to 4 times ratio (by volume) and was then uniformly coated on top of the active layer by doctor blade coating at 65° C. The dilution was achieved by adding isopropanol drop-wise while stirring the polymer at 600 rpm at room temperature in air. For the comparison device PEDOT:PSS (Heraeus Clevios HTL Solar 388) was coated without dilution using 0.18 mL and being uniformly coated by doctor blade at 65° C. All coatings were done in air. The substrates were then heated at 120 or 125° C. for 5 minutes in a nitrogen atmosphere. Afterwards Ag (100 nm) anode are thermally evaporated through a shadow mask to define the cells.

Devices with a fill-factor of more than 50% were exposed to continuous light at 100 mW/cm$^2$ intensity with AM1.5G spectrum for 140 hours. The devices were kept at open circuit load condition during the testing.

Table 4 shows the device characteristics for the individual OPV devices comprising a photoactive layer and a HSL made of PEDOT:PSS, and Example 2 measured with a mask to prevent current overestimation.

TABLE 4

Photovoltaic cell characteristics under simulated solar irradiation at 1 sun (AM1.5G)

| | Average Performance | | | | Ageing | |
|---|---|---|---|---|---|---|
| HSL | Voc mV | Jsc mA·cm$^{-2}$ | FF % | PCE % | Time h | Lost % vs T$_0$ |
| PEDOT:PSS | 703 | 12.9 | 56.2 | 5.1 | 140 | 66% |
| Example 2 | 713 | 12.0 | 64.3 | 5.5 | 140 | 82% |

From Table 4 it can be shown that OPV devices containing non-fullerene acceptors by example of the active layer ink PV-F1622 and an HSL with a polymer from Example 2 show equivalent or higher PCE to OPV device made of PEDOT:PSS with higher performance after ageing. Furthermore, devices including an HSL with a polymer from Example 2 show higher Voc and FF with comparison to PEDOT:PSS.

What is claimed is:

1. A photodiode comprising
a photoactive layer,
a hole collecting electrode and an electron collecting electrode located on opposite sides of the photoactive layer,
a first hole selective layer (HSL) which is located between the photoactive layer and the hole collecting electrode, and which comprises a fluoropolymer of formula I

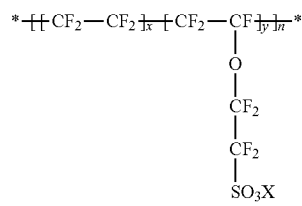

wherein
X is selected from the group consisting of H, Li, Na and K,
x is 0.01 to 0.99,
y is 0.99 to 0.01, and x+y=1,
n is an integer >1.

2. The photodiode according to claim 1, which is a photovoltaic (OPV) or photodetector (OPD) device.

3. The photodiode according to claim 1, wherein the first HSL further comprises a conductive polymer.

4. The photodiode according to claim 3, wherein the conductive polymer comprises one or more repeating units selected from the group consisting of the following formulae

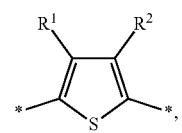

RU1

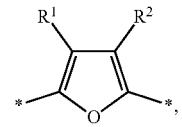

RU2

RU3 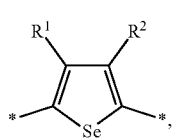
RU4 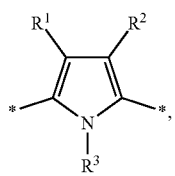
RU5 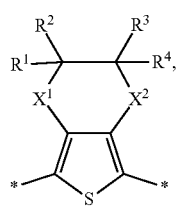
RU6 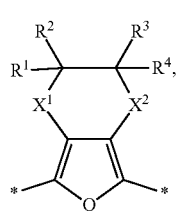
RU7 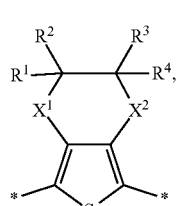
RU8 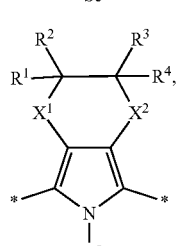
RU9 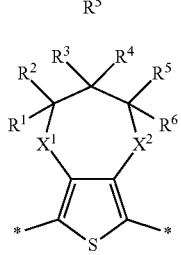
RU10 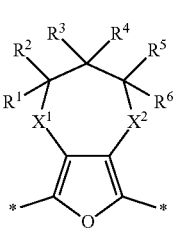
RU11 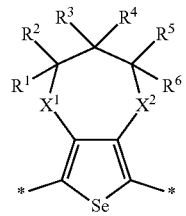
RU12 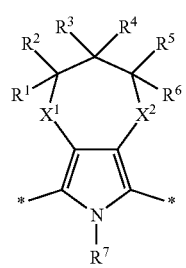
RU13 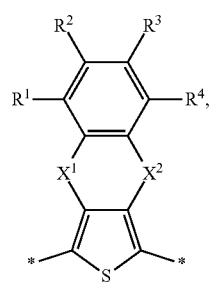
RU14 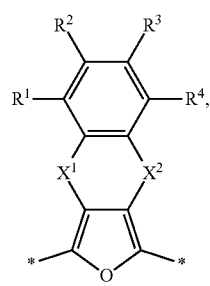
RU15 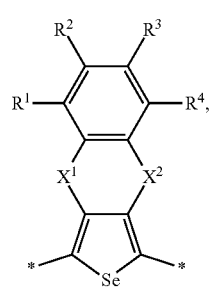

-continued
RU16 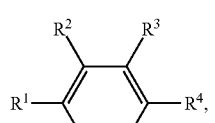
RU17 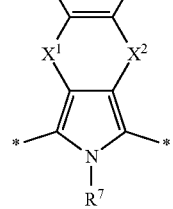
RU18 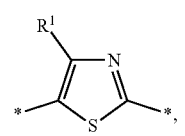
RU19 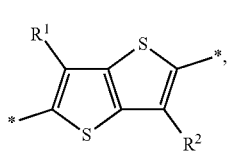
RU20 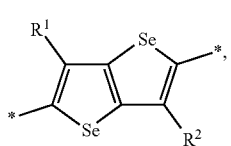
RU21 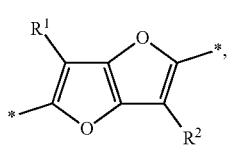
RU22 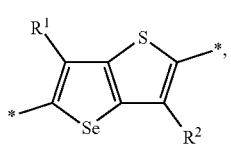
RU23 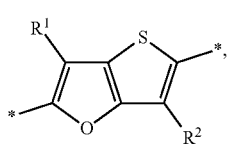
RU24 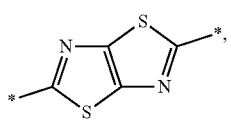
RU25 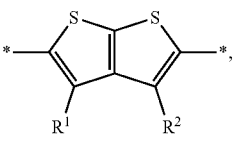
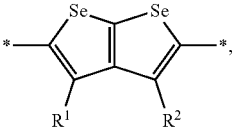
RU26 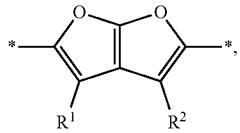
RU27 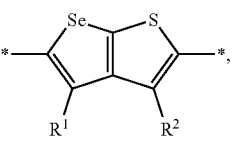
RU28 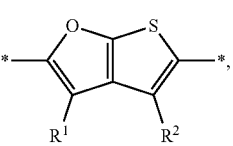
RU29 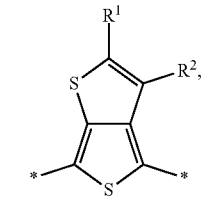
RU30 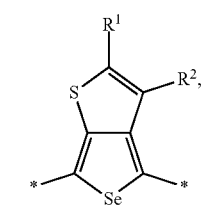
RU31 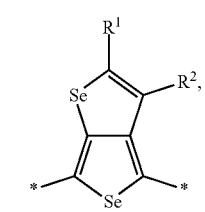
RU32 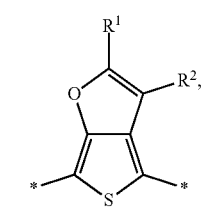
RU33 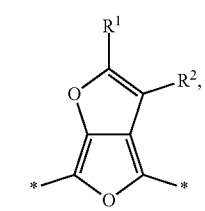

-continued

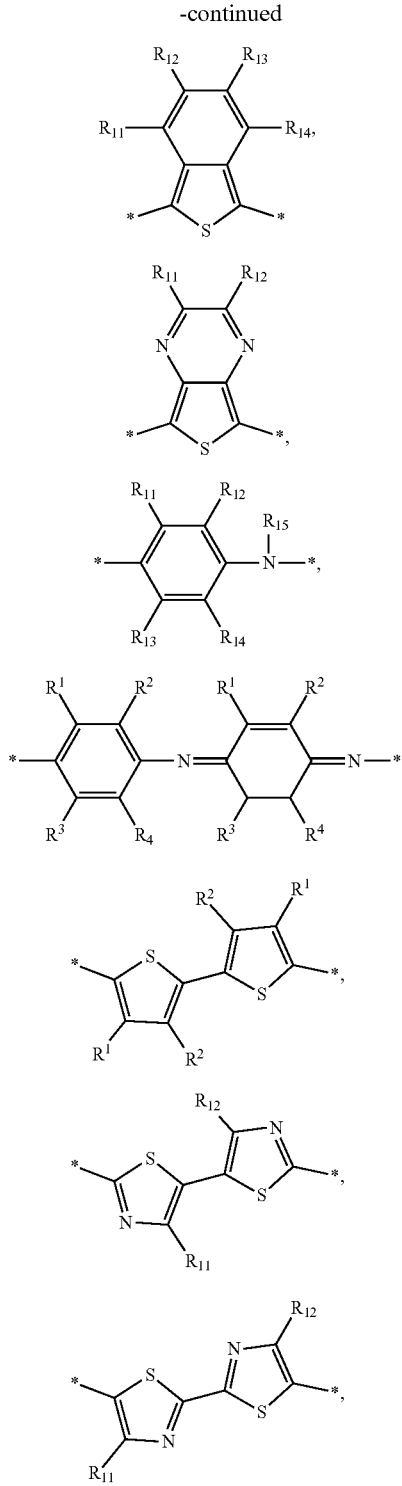

wherein the individual radicals, independently of each other and on each occurrence identically or differently, have the following meanings $X^1$, $X^2$ is O, S or Se, $R^{1-6}$ is selected from the group consisting of H, F, Cl, CN, and straight-chain, branched or cyclic alkyl with 1 to 30 C atoms, in which one or more $CH_2$ groups are each optionally replaced by —O—, —S—, —C(=O)—, —C(=S)—, —C(=O)—O—, —O—C(=O)—, —$NR^0$—, —Si $R^0$ $R^{00}$—, —$CF_2$—, —$CR^0$=$CR^{00}$—, —$CY^1$=$CY^2$— or —C≡C— in such a manner that O and/or S atoms are not linked directly to one another, and in which one or more H atoms are each optionally replaced by F, Cl, Br, I or CN, and in which one or more $CH_2$ or $CH_3$ groups are each optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, optionally contains fused rings, and is unsubstituted or substituted by one or more identical or different groups L, L is selected from the group consisting of F, Cl, —$NO_2$, —CN, —NC, —NCO, —NCS, —OCN, —SCN, $R^0$, O $R^0$, S $R^0$, —C(=O)X0, —C(=O) $R^0$, —C(=O)—$OR^0$, —O—C(=O)—$R^0$, —$NH_2$, —$NHR^0$, —$NR^0R^{00}$, —C(=O)$NHR^0$, —C(=O)$NR^0R^{00}$, —$SO_3R^0$, —$SO_3R^0$, —OH, —$CF_3$, —$SF_5$, or optionally substituted silyl, or carbyl or hydrocarbyl with 1 to 30 C atoms that is optionally substituted and optionally comprises one or more hetero atoms, $R^0$, $R^{00}$ are H or straight-chain or branched alkyl with 1 to 20 C atoms that is optionally fluorinated, $X^0$ is halogen.

5. The photodiode according to claim 4, wherein the conductive polymer comprises one or more repeating units selected from the group consisting of the following formulae

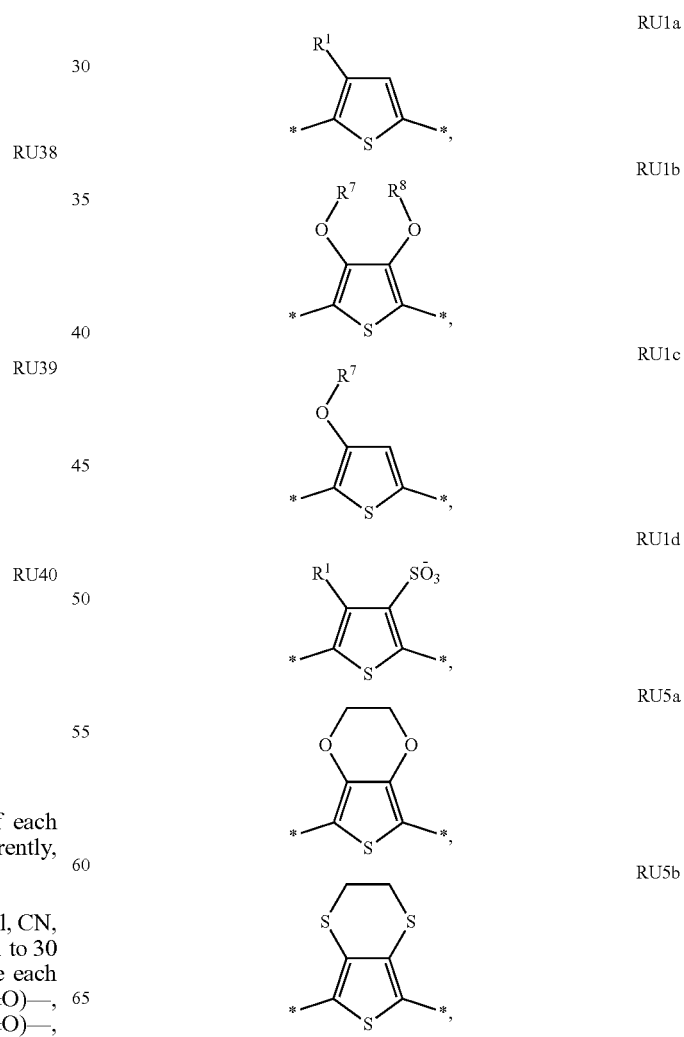

RU5c 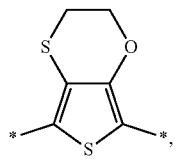

RU5d 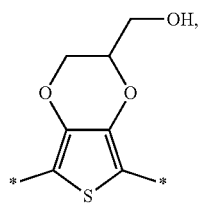

RU5e 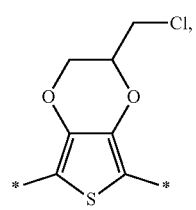

RU9a 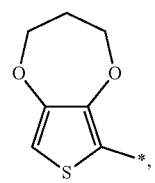

RU9b 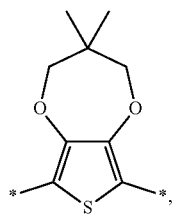

RU9c 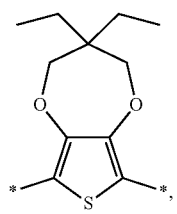

RU13a 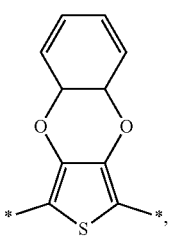

RU18a 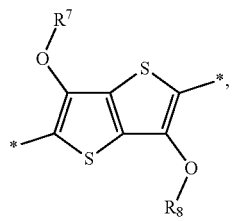

RU29a 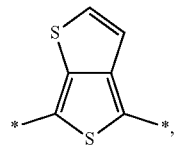

RU29b 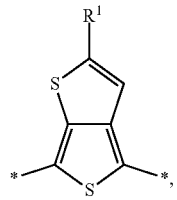

RU34a 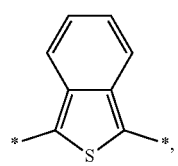

RU36a

RU37a 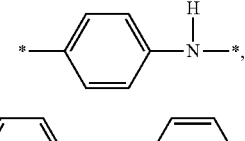

wherein $R^1$ is as defined in claim 4, and $R^7$ and $R^8$ denote, independently of each other and on each occurrence identically or differently, straight-chain, branched or cyclic alkyl with 1 to 30 C atoms, in which one or more H atoms are each optionally replaced by F.

6. The photodiode according to claim 5, wherein the conductive polymer is poly(3,4-ethylenedioxythiophene) (PEDOT), poly(3,4-ethylenedithiathiophene) (PEDTT) or poly(3-alkyl)thiophene wherein "alkyl" is $C_{1-12}$ alkyl or poly(thieno[3,4-b]thiophene).

7. The photodiode according to claim 1, wherein the photodiode further comprises, between the photoactive layer and the hole collecting electrode, a second HSL comprising the conductive polymer.

8. The photodiode according to claim 1, wherein the photoactive layer comprises, or is formed from, a p-type semiconductor which is selected from conjugated polymers, and an n-type semiconductor which is selected from the group consisting of fullerenes, fullerene derivatives and small molecules not containing a fullerene moiety.

9. The photodiode or process according to claim 8, wherein the p-type semiconductor and the n-type semiconductor form a bulk heterojunction.

10. The photodiode according to claim 1, which comprises the following sequence of layers from bottom to top:

optionally a first substrate (110),
a hole collecting electrode (120),
a hole selective layer (HSL) (130),
a photoactive layer (140) containing an n-type organic semiconducting (OSC) compound and a p-type OSC compound,
optionally an electron selective layer (ESL) (150),
an electron collecting electrode (160),
optionally a second substrate (170),
wherein the HSL (130) comprises a fluoropolymer of formula I as defined in claim 1.

11. The photodiode according to one or more of claim 1, which comprises the following sequence of layers from bottom to top:
optionally a first substrate (110),
an electron collecting electrode (160),
optionally an electron selective layer (ESL) (150),
a photoactive layer (140), containing an n-type organic semiconducting (OSC) compound and a p-type OSC compound,
a hole selective layer (HSL) (130),
a hole collecting electrode (120),
optionally a second substrate (170),
wherein the HSL (130) comprises a fluoropolymer of formula I as defined in claim 1.

12. A process of manufacturing an photodiode according to claim 1, comprising the following steps in the order from a) to h)
a) depositing a high work function electrode material onto a substrate (110) to form a hole collecting electrode (120),
b) optionally depositing a conductive polymer onto the hole collecting electrode (120) by a liquid-based process, to form a second HSL (180),
c) depositing a polymer of formula I or a composition or polymer blend according to the present invention as described above and below onto the hole collecting electrode (120) or, if present, onto the second HSL (180), to form a first HSL (130),
d) depositing an electron donor material and an electron acceptor material onto the first HSL (130) to form a photoactive layer (140),
e) optionally subjecting the photoactive layer (140) to thermal treatment, such as annealing, to form a randomly organized bulk heterojunction (BHJ),
f) optionally depositing an electron selective material onto the photoactive layer (140) to form an ESL (150), for example by a sputtering, vapour deposition or liquid-based process depending on the material used,
g) depositing a low work function electrode material onto the photoactive layer (140) or, if present, onto the ESL (150) to form an electron collecting electrode (160),
h) optionally applying a second substrate (170) onto the low work function electrode (160).

13. The process according to claim 12, comprising steps a) to h) in reverse order.

14. The process according to claim 12, wherein the photoactive layer comprises, or is formed from, a p-type semiconductor which is selected from conjugated polymers, and an n-type semiconductor which is selected from the group consisting of fullerenes, fullerene derivatives and small molecules not containing a fullerene moiety.

15. The process according to claim 14, wherein the p-type semiconductor and the n-type semiconductor form a bulk heterojunction.

16. A composition comprising
a fluoropolymer of formula I,

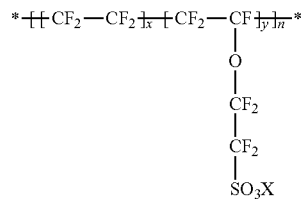

wherein
X is selected from the group consisting of H, Li, Na and K,
x is 0.01 to 0.99,
y is 0.99 to 0.01, and x+y=1,
n is an integer >1,
a conductive polymer, wherein the conductive polymer comprises one or more repeating units selected from the group consisting of the following formulae

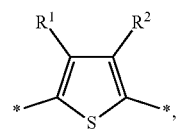
RU1

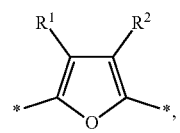
RU2

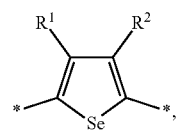
RU3

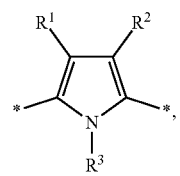
RU4

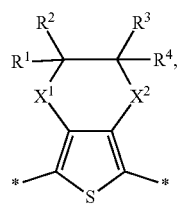
RU5

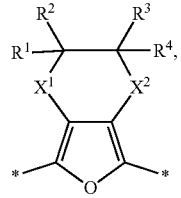
RU6

-continued
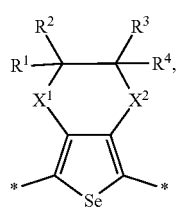 RU7
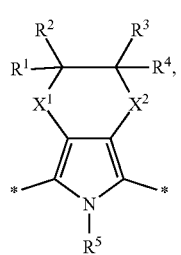 RU8
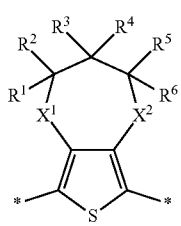 RU9
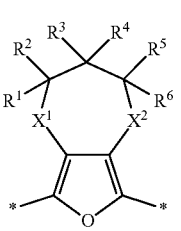 RU10
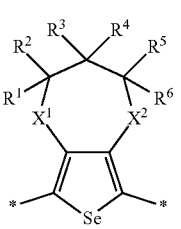 RU11
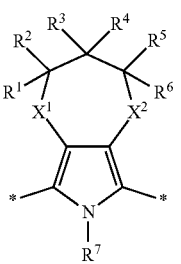 RU12
-continued
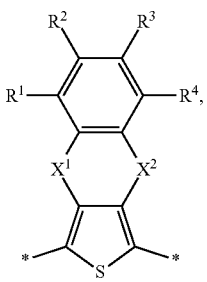 RU13
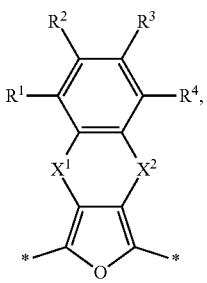 RU14
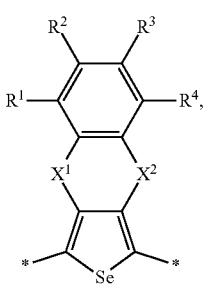 RU15
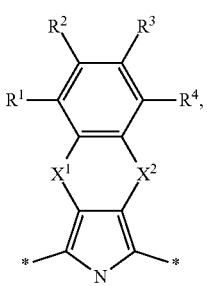 RU16
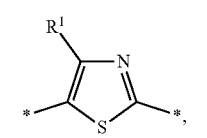 RU17
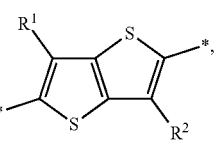 RU18
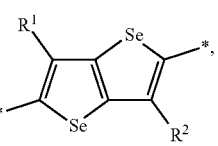 RU19

-continued
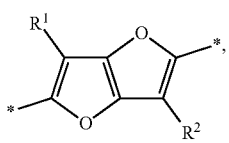 RU20
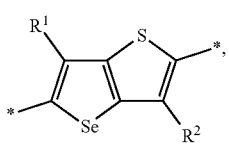 RU21
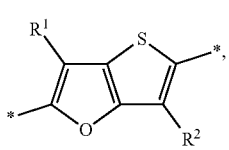 RU22
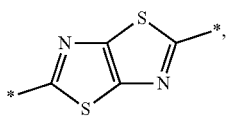 RU23
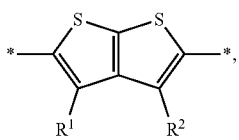 RU24
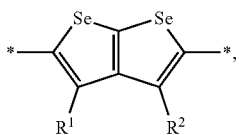 RU25
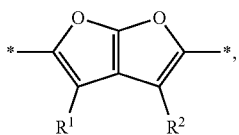 RU26
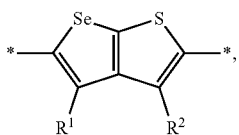 RU27
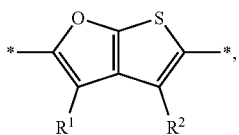 RU28
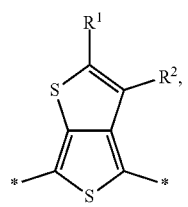 RU29
-continued
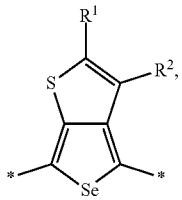 RU30
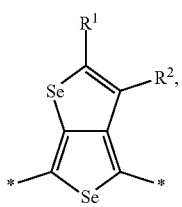 RU31
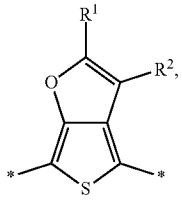 RU32
RU33
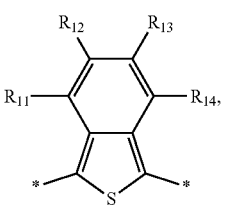 RU34
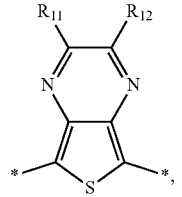 RU35
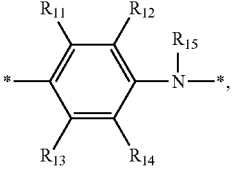 RU36
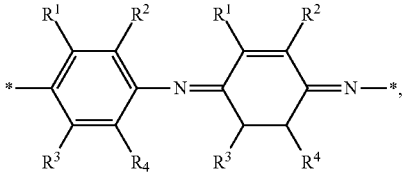 RU37

-continued

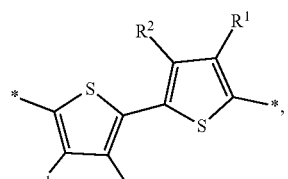
RU38

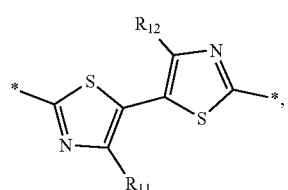
RU39

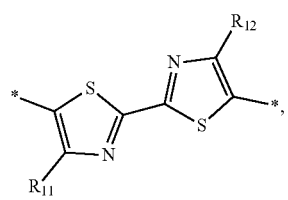
RU40 wherein the individual radicals, independently of each other and on each occurrence identically or differently, have the following meanings $X^1$, $X^2$ is O, S or Se, $R^{1-6}$ is selected from the group consisting of H, F, Cl, CN, and straight-chain, branched or cyclic alkyl with 1 to 30 C atoms, in which one or more $CH_2$ groups are each optionally replaced by —O—, —S—, —C(=O)—, —C(=S)—, —C(=O)—O—, —O—C(=O)—, —$NR^o$—, —Si $R^o$ $R^{oo}$—, —$CF_2$—, —$CR^o$=$CR^{oo}$—, —$CY^1$=$CY^2$— or —C≡C— in such a manner that O and/or S atoms are not linked directly to one another, and in which one or more H atoms are each optionally replaced by F, Cl, Br, I or CN, and in which one or more $CH_2$ or $CH_3$ groups are each optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, optionally contains fused rings, and is unsubstituted or substituted by one or more identical or different groups L, L is selected from the group consisting of F, Cl, —$NO_2$, —CN, —NC, —NCO, —NCS, —OCN, —SCN, $R^o$, O $R^o$, S $R^o$, —C(=O)$X^0$, —C(=O) $R^o$, —C(=O)—$OR^o$, —O—C(=O)—$R^o$, —$NH_2$, —$NHR^o$, —$NR^oR^{oo}$, —C(=O)$NHR^o$, —C(=O)$NR^oR^{oo}$, —$SO_3R^o$, —$SO_2R^o$, —OH, —$CF_3$, —$SF_5$, or optionally substituted silyl, or carbyl or hydrocarbyl with 1 to 30 C atoms that is optionally substituted and optionally comprises one or more hetero atoms, $R^o$, $R^{oo}$ are H or straight-chain or branched alkyl with 1 to 20 C atoms that is optionally fluorinated, $X^0$ is halogen, and one or more solvents, wherein the composition does not contain poly(styrenesulfonic acid) or a poly(styrenesulfonate).

17. The composition according to claim 16, wherein the conductive polymer comprises one or more repeating units selected from the group consisting of the following formulae

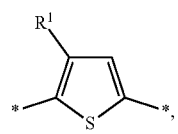
RU1a

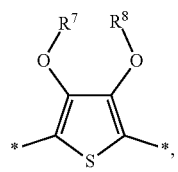
RU1b

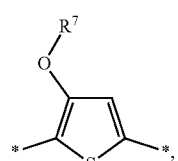
RU1c

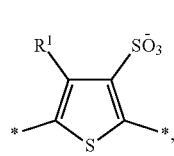
RU1d

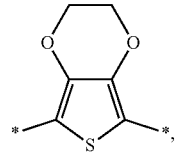
RU5a

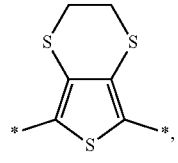
RU5b

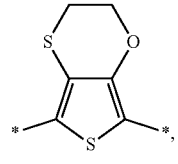
RU5c

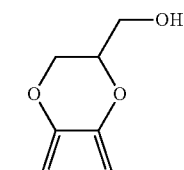
RU5d

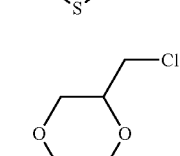
RU5e

RU9a 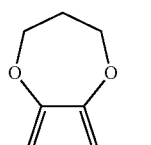

RU9b 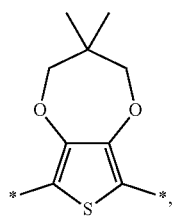

RU9c 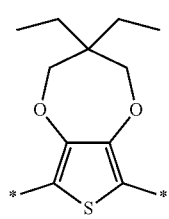

RU13a 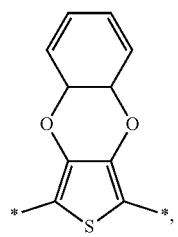

RU18a 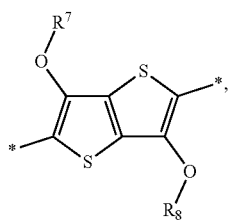

RU29a 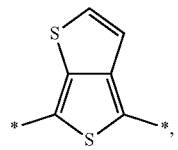

RU29b 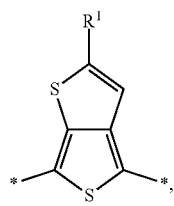

RU34a 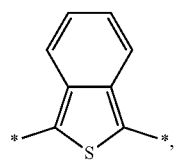

RU36a 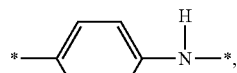

RU37a 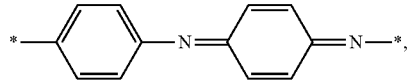

wherein $R^1$ is as defined in claim 4, and $R^7$ and $R^8$ denote, independently of each other and on each occurrence identically or differently, straight-chain, branched or cyclic alkyl with 1 to 30 C atoms, in which one or more H atoms are each optionally replaced by F.

18. The composition according to claim 17, wherein the conductive polymer is poly(3,4-ethylenedioxythiophene) (PEDOT), poly(3,4-ethylenedithiathiophene) (PEDTT) or poly(3-alkyl)thiophene wherein "alkyl" is $C_{1-12}$ alkyl or poly(thieno[3,4-b]thiophene).

19. The composition according to claim 16, which is an aqueous dispersion that optionally contains one or more organic solvents that are water-miscible or soluble up to a certain concentration in water.

20. The composition according to claim 19, wherein the solvents are exclusively selected from organic solvents.

21. The composition according to claim 16, wherein the conductive polymer is prepared by oxidative polymerization process by providing a solution or dispersion containing one or more corresponding monomers forming the conductive polymer and optionally a fluoropolymer of formula I, and adding an oxidizing agent and/or a catalyst.

22. The composition according to one or more of claim 16, which further comprises one or more of the following components:
 one or more ionic or zwitterionic species,
 one or more additional polymers,
 one or more additives selected from the group consisting of binders,
 crosslinking agents, viscosity modifiers, pH regulators, additives which increase the conductivity, antioxidants, additives which modify the work function, auxiliary solvents for homogeneous mixing of the individual components, or a mixture of two or more of the aforementioned additives.

23. A polymer blend which contains a fluoropolymer of formula I, $$*\mathrm{-\!\!+\!\![CF_2\!-\!CF_2]_x\!\!+\!\![CF_2\!-\!CF]_y\!\!+_n\!\!-*}$$
$$\mathrm{\underset{SO_3X}{\overset{|}{O}\!-\!CF_2\!-\!CF_2}}$$

wherein
X is selected from the group consisting of H, Li, Na and K,
x is 0.01 to 0.99,
y is 0.99 to 0.01, and x+y=1,
n is an integer >1,
a conductive polymer, wherein the conductive polymer comprises one or more repeating units selected from the group consisting of the following formulae -continued
RU1 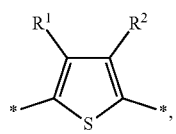
RU2 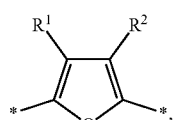
RU3 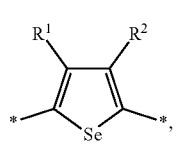
RU4 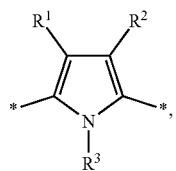
RU5 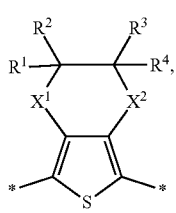
RU6 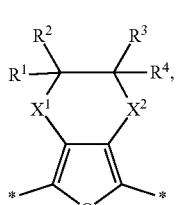
RU7 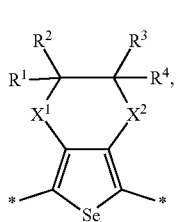
RU8 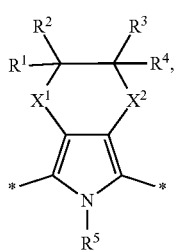
RU9 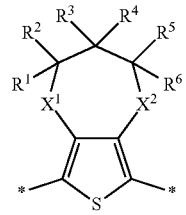
RU10 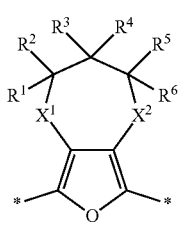
RU11 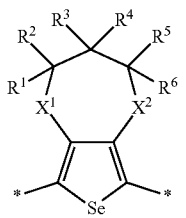
RU12 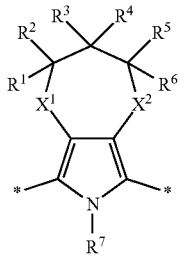
RU13 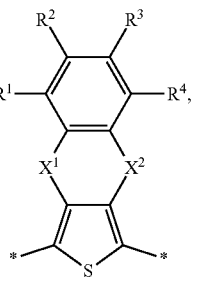
RU14 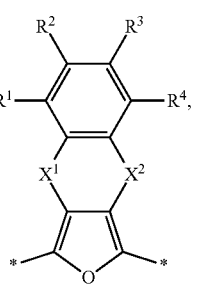

RU15 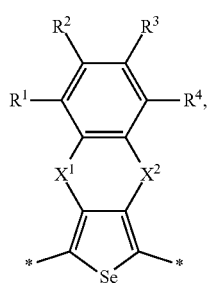
RU16 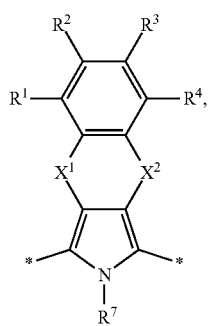
RU17 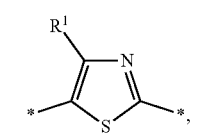
RU18 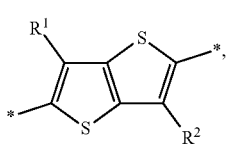
RU19 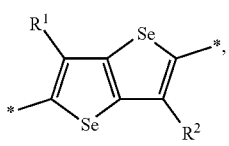
RU20 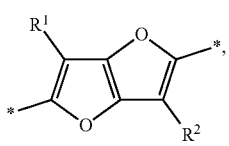
RU21 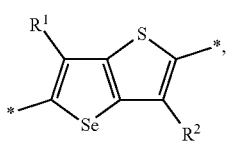
RU22 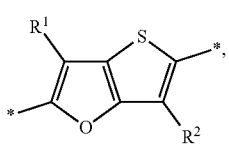
RU23 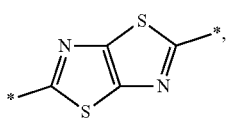
RU24 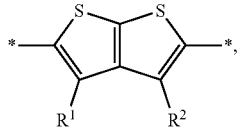
RU25 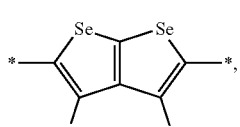
RU26 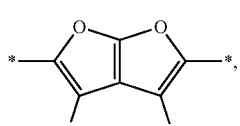
RU27 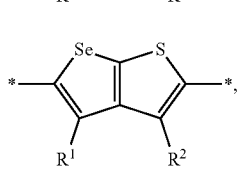
RU28 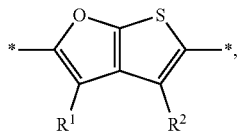
RU29 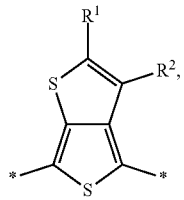
RU30 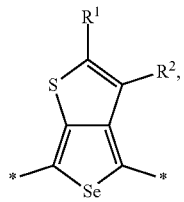
RU31 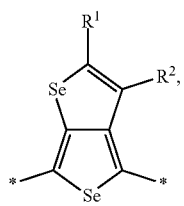
RU32 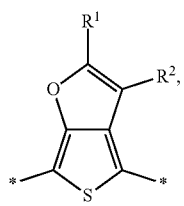

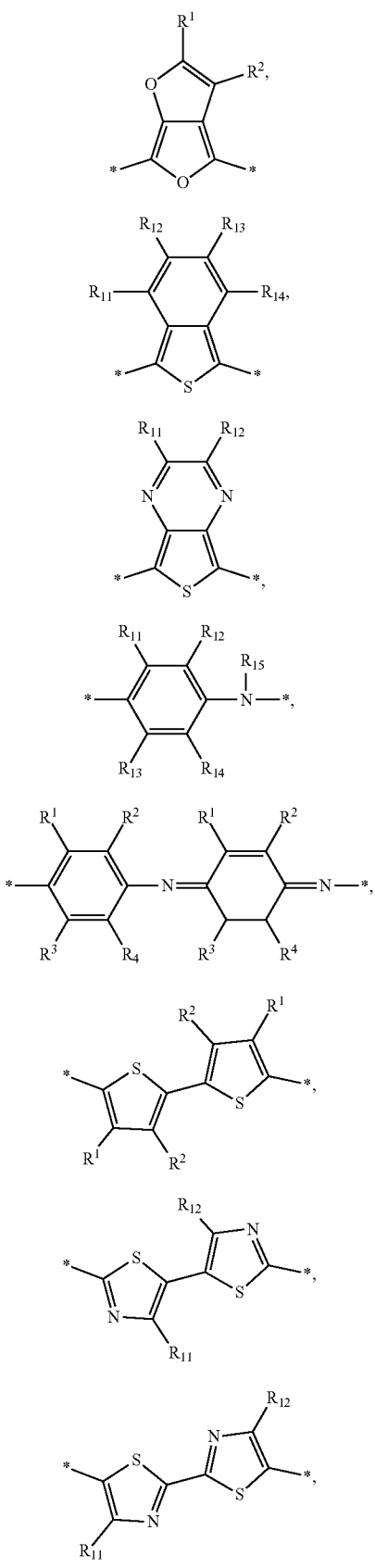

wherein the individual radicals, independently of each other and on each occurrence identically or differently, have the following meanings $X^1$, $X^2$ is O, S or Se, $R^{1-6}$ is selected from the group consisting of H, F, Cl, CN, and straight-chain, branched or cyclic alkyl with 1 to 30 C atoms, in which one or more $CH_2$ groups are each optionally replaced by —O—, —S—, —C(=O)—, —C(=S)—, —C(=O)—O—, —O—C(=O)—, —NR⁰—, —Si R⁰ R⁰⁰—, —CR⁰=CR⁰⁰—, —CY¹=CY²— or —C≡C— in such a manner that O and/or S atoms are not linked directly to one another, and in which one or more H atoms are each optionally replaced by F, Cl, Br, I or CN, and in which one or more $CH_2$ or $CH_3$ groups are each optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, optionally contains fused rings, and is unsubstituted or substituted by one or more identical or different groups L, L is selected from the group consisting of F, Cl, —$NO_2$, —CN, —NC, —NCO, —NCS, —OCN, —SCN, R⁰, O R⁰, S R⁰, —C(=O)X0, —C(=O) R⁰, —C(=O)—OR⁰, —O—C(=O)—R⁰, —$NH_2$, —NHR⁰, —NR⁰R⁰⁰, —C(=O)NHR⁰, —C(=O)NR⁰R⁰⁰, —$SO_3$R⁰, —$So_2$R⁰, —OH, —$CF_3$, —$SF_5$, or optionally substituted silyl, or carbyl or hydrocarbyl with 1 to 30 C atoms that is optionally substituted and optionally comprises one or more hetero atoms, R⁰, R⁰⁰ are H or straight-chain or branched alkyl with 1 to 20 C atoms that is optionally fluorinated, X⁰ is halogen, and which does not contain poly(styrenesulfonic acid) or a poly(styrenesulfonate).

24. The polymer blend according to claim 23, wherein the conductive polymer comprises one or more repeating units selected from the group consisting of the following formulae

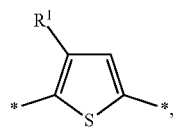
RU1a

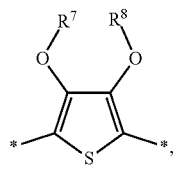
RU1b

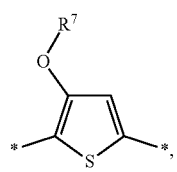
RU1c

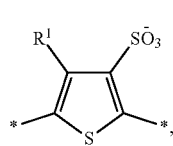
RU1d

RU5a 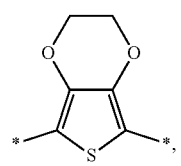

RU5b 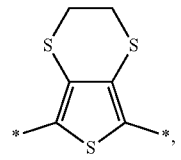

RU5c 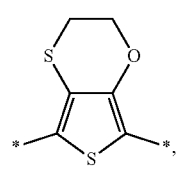

RU5d 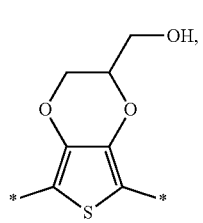

RU5e 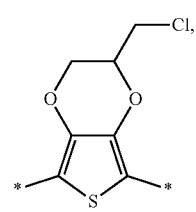

RU9a 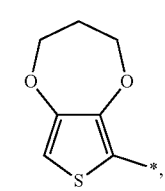

RU9b 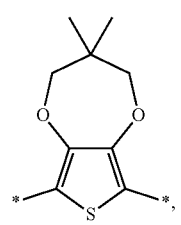

RU9c 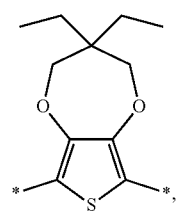

RU13a 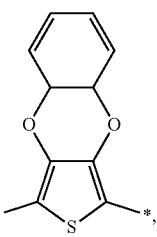

RU18a 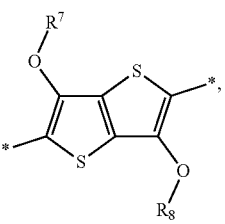

RU29a 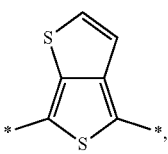

RU29b 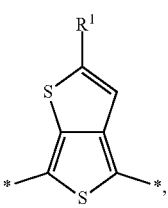

RU34a 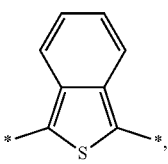

RU36a 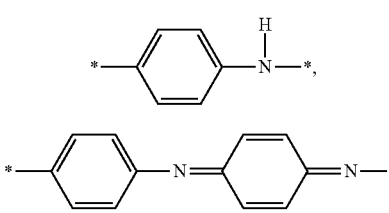

RU37a 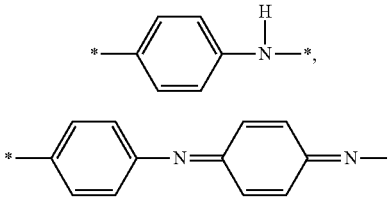

wherein $R^1$ is as defined in claim 4, and $R^7$ and $R^8$ denote, independently of each other and on each occurrence identically or differently, straight-chain, branched or cyclic alkyl with 1 to 30 C atoms, in which one or more H atoms are each optionally replaced by F.

25. The polymer blend according to claim 24, wherein the conductive polymer is poly(3,4-ethylenedioxythiophene) (PEDOT), poly(3,4-ethylenedithiathiophene) (PEDTT) or poly(3-alkyl)thiophene wherein "alkyl" is $C_{1-12}$ alkyl or poly(thieno[3,4-b]thiophene).

26. The polymer blend according to one or more of claim 23, wherein the conductive polymer is prepared by oxidative polymerization process by providing an aqueous solution or dispersion containing one or more corresponding monomers forming the conductive polymer and optionally a fluoropolymer of formula I, and adding an oxidizing agent and a catalyst.

27. The polymer blend according to one or more of claim 23, which further comprises one or more of the following components:
- one or more ionic or zwitterionic species,
- one or more additional polymers,
- one or more additives selected from the group consisting of binders,
- crosslinking agents, viscosity modifiers, pH regulators, additives which increase the conductivity, antioxidants, additives which modify the work function, auxiliary solvents for homogeneous mixing of the individual components, or a mixture of two or more of the aforementioned additives.

\* \* \* \* \*